(12) United States Patent
Shiramizu et al.

(10) Patent No.: US 7,212,744 B2
(45) Date of Patent: May 1, 2007

(54) RECEIVER CIRCUIT AND TRANSMITTER CIRCUIT

(75) Inventors: Nobuhiro Shiramizu, Kokubunji (JP); Kenichi Ohhata, Hachioji (JP); Fumihiko Arakawa, Tokorozawa (JP); Takeshi Kusunoki, Tachikawa (JP)

(73) Assignee: Renesas Technology Corp, Tokyo (JP)

( * ) Notice: Subject to any disclaimer, the term of this patent is extended or adjusted under 35 U.S.C. 154(b) by 595 days.

(21) Appl. No.: 10/759,101

(22) Filed: Jan. 20, 2004

(65) Prior Publication Data

US 2004/0151506 A1 Aug. 5, 2004

(30) Foreign Application Priority Data

Jan. 31, 2003 (JP) .............................. 2003-023446

(51) Int. Cl.
*H04B 10/00* (2006.01)
*H04J 4/00* (2006.01)
*H04L 7/00* (2006.01)

(52) U.S. Cl. ....................... 398/154; 398/155; 398/74; 375/355

(58) Field of Classification Search .................. 398/74, 398/75, 154, 155, 163; 375/354, 355, 359, 375/371, 373, 376

See application file for complete search history.

(56) References Cited

U.S. PATENT DOCUMENTS 6,999,543 B1 * 2/2006 Trinh et al. .................. 375/355
2004/0228636 A1 * 11/2004 Pathak et al. ................ 398/155

OTHER PUBLICATIONS

H. M. Rein, "Si and SiGe Bipolar ICs for 10 to 40 Gb/s Optical-Fiber TDM Links", Internatinoal Journal of High Speed Electronics and Systems, vol. 9, No. 2 (1998), published by World Scientific Publishing Company, pp. 347-383.

Zhihao H. Lao et al., "A 12 Gb/s Bipolar 4:1-Multiplexer IC for SDH Systems", IEEE Journal of Solid-State Circuits, vol. 30, No. 2, Feb. 1995, pp. 129-132.

* cited by examiner

*Primary Examiner*—Dalzid Singh
(74) *Attorney, Agent, or Firm*—Reed Smith LLP; Stanley P. Fisher, Esq.; Juan Carlos A. Marquez, Esq.

(57) ABSTRACT

The invention provides a transceiver circuit for communication that enhances the operation frequency of a synchronous digital circuit up to the maximum frequency of a flip-flop and inhibits the occurrence of jitters.

A clock signal synchronized with data at f1/n Hz is converted by a multiplier so that the signal has a frequency of "n" times so as to use the clock signal for triggering a flip-flop the operation frequency of which is f1 b/s in the synchronous digital circuit. The multiplier is arranged in the vicinity of the flip-flop triggered by the clock signal of f1 Hz so as to avoid the effect of the deterioration of the operation frequency by interconnect capacitance.

The maximum operation frequency of the transceiver circuit determined based upon the operating frequency of the synchronous digital circuit can be enhanced up to the maximum operation frequency of the flip-flop. As a margin can be produced in designing a frequency band of a clock signal processing circuit, the reduction of power consumption, the reduction of phase noise and the extension of a control frequency range can be realized.

19 Claims, 11 Drawing Sheets

RECEIVER CIRCUIT AND TRANSMITTER CIRCUIT

BACKGROUND OF THE INVENTION

1. Field of the Invention

The present invention relates to a transmitter circuit and a receiver circuit for communication that are synchronized with a clock and execute data signal processing.

2. Description of the Prior Art

Recently, to increase data communications traffic, the enhancement of the data rate of a communication system is demanded and high-speed performance is essential for an element circuit of the system. Particularly, concerning a circuit for optical communication, to utilize the very high speed transmission characteristic of an optical fiber to the maximum, the enhancement of the operating speed is strongly demanded.

Factors which limit a data rate will be described below. To transmit at precise timing, a circuit for communication is operated in synchronization with an external reference clock. In transmitting, a data waveform is shaped using a clock signal and data is transmitted, and in receiving, data is decided using the clock signal extracted from a received data waveform. As a clock signal determines the transmission of data and the timing of receiving, the maximum frequency of the clock signal determines a maximum operation frequency required in a communication circuit as it is.

That is, as the clock signal has the highest frequency component in the circuit for communication, the upper limit of the operation frequency of its clock signal processing circuit is required to exceed at least the frequency of the clock signal. In a high frequency, the upper limit of the operation frequency of the clock signal processing circuit is determined under the effect of the characteristics of devices forming the circuit and a wire parasitic element. In case a clock signal equal to or exceeding the operating frequency is input to the clock signal processing circuit, the amplitude of the clock signal decreases and therefore, an error occurs in the operation of a circuit of a synchronous type such as a flip-flop. Therefore, the maximum operation frequency of the clock signal processing circuit is an important element that determines the operation frequency of the circuit for communication.

In such a circuit for optical communication, a system in which a transmitter circuit and a receiver circuit respectively formed using a circuit of a synchronous type are connected via an optical fiber as shown in FIG. 2 is known. (For example, see FIG. 1 in a non-patent document 1. It is hereinafter called a conventional type example 1.)

As shown in FIG. 2, parallel data signals and a clock signal are input to the transmitter circuit TRM. A multiplexer (MUX) 30 is a circuit for time-division multiplexing the parallel data signals to a serial data signal. "m" pieces of parallel data signals can be multiplexed to a serial data signal of a data rate of f1 b/s at a data rate f1/m b/s. In this case, "m" is the power of 2 and FIG. 2 shows a case of "m=4". The multiplexed data signal is converted to an optical signal via an electrical/optical converter composed of a laser diode 40, a modulator 41 and a driver 42.

The optical signal input to the receiver circuit RCV via an optical fiber 33 is converted and amplified to an electrical signal by a photo diode 31, a preamplifier 32 and a main amplifier 35. This signal is demultiplexed, one is input to a decision circuit 36 and the other is input to a clock extracting circuit 2a. The clock extracting circuit 2a is a circuit for recovering the clock signal based upon the data signal. The decision circuit 36 decides and outputs a code of data at precise timing using the recovered clock signal and inputs it to a demultiplexer (DEMUX) circuit 34. The demultiplexer circuit 34 demultiplexes and outputs the serial data signal of the data rate of f1 b/s to the "m" pieces of parallel data signals at the data rate of f1/m b/s using a clock signal acquired by dividing the recovered clock signal into a frequency f1/2 Hz in a frequency divider 20. According to this configuration, "m" pieces of data signals of the data rate of f1/m b/s which can be easily processed in an electrical circuit can be transmitted simultaneously and in parallel on one optical fiber. In FIG. 2, an external clock having a frequency of 5 GHz is input to the transmitter having a data rate of 10 Gb/s.

In case a circuit for communication is actually applied to an optical transmission system, it is strongly demanded to reduce the jitter of an output waveform and to retime so as to possibly reduce a communication error. Therefore, a master-slave-D flip-flop MS for retiming is arranged next to the output of the multiplexer MUX as shown in FIG. 3 (For example, see FIG. 1 in a non-patent document 2. It is hereinafter called a conventional type example 2), and a clock signal having a frequency of f1 Hz is input to data of the data rate of f1 b/s so as to shape its waveform.

A clock signal having the frequency of f1 Hz is also input to the receiver circuit so as to drive the decision circuit 36 and a waveform is precisely reshaped. In FIG. 3, a reference number M denotes a master of the master-slave D flip-flop and S denotes a slave of the master-slave D flip-flop. A reference number 20a denotes a frequency divider, 23 denotes a data output buffer circuit, 24 denotes a phase shifter circuit that enables the phasing of a clock signal so that the clock signal is input at a suitable time slot, 25 denotes a clock buffer circuit, and T1 and T2 denote a control signal input terminal for controlling a phase.

Operation using a clock having the frequency of f1 Hz at the data rate of f1 b/s is called full rate operation. In not only the configuration of the transmitter circuit shown in FIG. 2 but the configuration of a circuit shown in FIG. 4 (For example, see FIG. 16 in the non-patent document 1. It is hereinafter called a conventional type example 3), a clock signal having a frequency of 20 GHz is also input to data of a data rate of 40 Gb/s in a receiver circuit RCV. As described above, the operation of the transmitter circuit and the receiver circuit using a clock signal having the frequency of f1/2 Hz at the data rate of f1 b/s is called half rate operation.

[Non-Patent Document 1]
 pp. 347 to 383 of "Si and SiGe BIPOLAR ICs for 10 TO 40 Gb/s OPTICAL-FIBER TDM LINKS" written by H.-M. REIN and published in 1998 by World Scientific Publishing Company in Vol. 9, No. 2 of International Journal of High Speed Electronics and Systems

[Non-Patent Document 2]
 pp. 129 to 132 of Vol. 30 of "A 12-Gb/s Si Bipolar 4:1-Multiplexer IC for SDH Systems" written by Z. H. Lao, et al. and published in 1995 in Vol. 30, No. 2 of IEEE Journal of Solid-state Circuits

SUMMARY OF THE INVENTION

The maximum operation frequency of a circuit for communication is determined by the characteristics of a transistor and a transmission line and the configuration of the circuit and particularly, a circuit for processing a clock signal is important. In the case of full rate operation, a clock signal has the highest frequency component and a circuit on which the signal is sent determines the operation frequency of the whole circuitry.

For a circuit for processing a clock signal having the highest frequency, there are plural blocks such as a clock buffer circuit for transmitting a signal to interconnect between circuit blocks and a phase/frequency comparator, a voltage controlled oscillator and a flip-flop respectively forming a synchronous circuit. The maximum operation frequency at which the flip-flop is operated is acquired as the maximum switching frequency of a transistor in case the amplitude of an input clock signal is the same as that in low-speed operation.

However, in an actual communication circuit, the amplitude of a clock signal attenuates before the flip-flop reaches the maximum operation frequency by the limitation of a band in the clock buffer circuit and others except the flip-flop, malfunction occurs in the flip-flop and an operation frequency at this time becomes the maximum operation frequency of the circuit for communication.

Therefore, the operation frequency of the circuit for communication can be enhanced up to the maximum operation frequency of the flip-flop by reducing a block for processing a clock signal having the highest frequency and removing the limitation of a band. Therefore, the half rate operation in the above-mentioned conventional type example 2 and conventional type example 3 in which a frequency of a clock signal is halved, the limitation of clock signal processing is relieved and operation up to the limit of data signal processing is enabled is proposed.

The half rate operation uses both the timing of a leading edge and the timing of a trailing edge of a clock signal for the timing of decision. In the meantime, the full rate operation uses only either of a leading edge or a trailing edge for the timing of discrimination and decision. In the half rate operation, as an interval between a leading edge and a trailing edge has only to be the same as the length of a code of a data signal, the same data rate can be realized by a clock signal having a half frequency of a frequency in the full rate operation.

However, the half rate operation has a problem that jitter increases and an error rate is deteriorated. The cause is that as paths of current in a circuit are different at the leading edge and at the trailing edge of a clock signal, values of parasitic capacitance in charge and discharge are different and rise time and fall time are different. Particularly, in case an emitter follower is utilized for the former buffer, current values supplied for switching are different and large difference is made between rise time and fall time. To solve the problem, a circuit in which symmetry such as rise time and fall time are equal is considered is demanded, however, it is difficult to configure a circuit in which symmetry and an operation frequency are compatible.

In half rate operation, as a data signal is switched both at a leading edge and at a trailing edge of a clock signal, the timing of switching lags because of difference between respective time and the duty ratio of a data signal varies. Large jitter occurs in a data signal the duty ratio of which varies.

As described above, the prior art has a problem that in the case of full rate operation, as the transmission of a high frequency of a clock signal is difficult, the deterioration of the operation frequency is caused and in the case of half rate operation, jitter increases.

The object of the invention is to provide a receiver circuit and a transmitter circuit in which the operation frequency of a clock signal processing circuit is enhanced up to the maximum frequency of a flip-flop and the occurrence of jitters is inhibited.

Means to Solve the Problem (1) A representative receiver circuit according to the invention is provided with a synchronous circuit that recovers and outputs a clock signal having a frequency of f1/n Hz (n: 2 or larger natural number) synchronized with input one data signal the data rate of which is f1 b/s (f1: positive real number), "j" pieces of multipliers that output each clock signal acquired by multiplying a clock signal output from the synchronous circuit via. "j" pieces of interconnects (j: one or larger natural number) by predetermined multiple ratio and a synchronous digital circuit that has "j" pieces of parallel input terminals including one common to the input of the synchronous circuit, "j×k" pieces of parallel output terminals and "j" pieces of parallel clock input terminals, decides and recovers "j" pieces of data signals the data rate of each of which is f1 b/s and which are input to the "j" pieces of parallel input terminals using the "j" pieces of multiplied clock signals applied to the "j" pieces of parallel clock input terminals via (j+1)th to (2×j)th interconnects as a criterion of timing, demultiplexes the data in the ratio of "1:k" and converts to "j×k" pieces of data signals the data rate of each of which is f1/k b/s.

The above-mentioned representative receiver circuit according to the invention is characterized in that the "j" pieces of parallel terminals to which data signals are input of the synchronous digital circuit function as the input terminal of the receiver circuit, the "j×k" pieces of parallel terminals from which the data signals are output function as the output terminal of the receiver circuit, and first to "j"th interconnects connecting the output terminal of the synchronous circuit and the input terminals of the "j" pieces of multipliers and "j+1"th to "2×j"th interconnects connecting the "j" pieces of multipliers and the "j" pieces of parallel clock input terminals of the digital circuit are arranged so that delays t2max are smaller out of the maximum value t1max s of delays caused on the first to the "j"th interconnects and the maximum value t2max s of delays caused on the "j+1"th to the "2×j"th interconnects and the delays t2max are equivalent to 1/10 or less of a clock cycle 1/f1 s output from each multiplier.

(2) Besides, a representative transmitter circuit according to the invention is provided with a synchronous circuit to which a clock signal having a frequency of f1/m/n Hz (f1: positive real number, m: one or larger natural number, n: 2 or larger natural number) is input and from which a clock signal having a frequency of f1/n Hz and synchronized with the input clock signal is output, "j" pieces of multipliers to which the clock signals output from the synchronous circuit are input via first to "j"th (j: one or larger natural number) interconnects and from each of which a clock signal multiplied by predetermined multiple ratio is output and a synchronous digital circuit that has input terminals for receiving "j×k" pieces of parallel data signals (k: 2 or larger natural number), output terminals for outputting "j" pieces of parallel data signals and "j" pieces of parallel clock input terminals, decides and recovers "j×k" pieces of data signals which are input to the input terminals and the data rate of each of which is f1/k b/s using "j" pieces of multiplied clock signals applied to "j" pieces of parallel clock input terminals via "j+1"th to "2×j"th interconnects as a criterion of timing, performs time-division multiplexing in the ratio of "k:1"

and converts to "j" pieces of data signals the data rate of each of which is f1 b/s. The above-mentioned representative transmitter circuit according to the invention is characterized in that the terminals for receiving "j×k" pieces of parallel data signals of the synchronous digital circuit function as the input terminals of the transmitter circuit, the terminals for outputting "j" pieces of parallel data output signals function as the output terminals of the transmitter circuit, and first to "j"th interconnects connecting the output terminal of the synchronous circuit and the input terminals of "j" pieces of multipliers and "j+1"th to "2×j"th interconnects connecting the "j" pieces of multipliers and "j" pieces of parallel clock input terminals of the digital circuit are arranged so that delays t2max are smaller out of the maximum value t1max s of delays caused on the first to "j"th interconnects and the maximum value t2max s of delays caused on the "j+1"th to the "2×j "th interconnects and the delays t2max are equivalent to 1/10 or less of a clock cycle 1/f1 s output from each multiplier.

Besides, the above-mentioned transmitter circuit is characterized in that the multiplier is composed of an exclusive-OR circuit and a 90-degree phase shifter, a signal input to the multiplier is branched, one is input to the exclusive-OR circuit, the branched other signal is input to the other input terminal of the exclusive-OR circuit via the 90-degree phase shifter and the output of the exclusive-OR circuit functions as the output of the multiplier.

(3) It is suitable that the receiver circuit described in above (1) or the transmitter circuit described in above (2) is configured so that a signal input to the multiplier is a differential signal, the differential signal is input to a first input terminal of the exclusive-OR circuit as a first input signal and a differential signal output from the 90-degree phase shifter is input to a second input terminal as a second input signal, the multiplier is provided with first to seventh transistors, first to third resistors and first to third constant-voltage terminals, the normal phase of the first input signal is input to the bases of the first and the fourth transistors, the reverse phase of the first input signal is input to the bases of the second and the fourth transistors, the normal phase of the second input signal is input to the bases of the fifth and the sixth transistors, a common collector of the first and the third transistors is connected to the first constant-voltage terminal via the first resistor, a common collector of the second and the fourth transistors is connected to the first constant-voltage terminal via the second resistor, the collector of the fifth transistor is connected to a common emitter of the first and the second transistors, the collector of the sixth transistor is connected to a common emitter of the third and the fourth transistors, the collector of the seventh transistor is connected to a common emitter of the fifth and the sixth transistors, the base of the seventh transistor is connected to the third constant-voltage terminal, the emitter of the seventh transistor is connected to the second constant-voltage terminal via the third resistor, the common collector of the first and the third transistors functions as the output terminal of a normal phase of the multiplier and the common collector of the second and the fourth transistors functions as the output terminal of a reverse phase of the multiplier.

(4) Besides, the receiver circuit described in above (1) or the transmitter circuit described in above (2) may be also configured so that the multiplier is provided with first to third transistors, a first resistor and first to third constant-voltage terminals, a normal phase of an input differential signal is input to the base of the first transistor, the reverse phase is input to the base of the second transistor, a common collector of the first and the second transistors is connected to the first constant-voltage terminal, a common emitter is connected to the collector of the third transistor, the base of the third transistor is connected to the third constant-voltage terminal, the emitter is connected to the second constant-voltage terminal via the first resistor and the full wave rectified waveform of an input signal is output using the common emitter of the first and the second transistors as an output terminal.

(5) Besides, the receiver circuit described in above (1) or the transmitter circuit described in above (2) may be also configured so that the multiplier is provided with first to fourth diodes, a normal phase of an input differential signal is input to an anode of the first diode and a cathode of the third diode, the reverse phase is input to an anode of the second diode and a cathode of the fourth diode and the full wave rectified waveform of an input signal is output using a common cathode of the first and the second diodes as a first output terminal and using a common anode of the third and the fourth diodes as a second output terminal.

The above-mentioned objects and another object of the invention will be clarified by the following detailed description and attached claims, referring to attached drawings.

DETAILED DESCRIPTION OF THE PREFERRED EMBODIMENTS

<First Embodiment>

Figure 1:
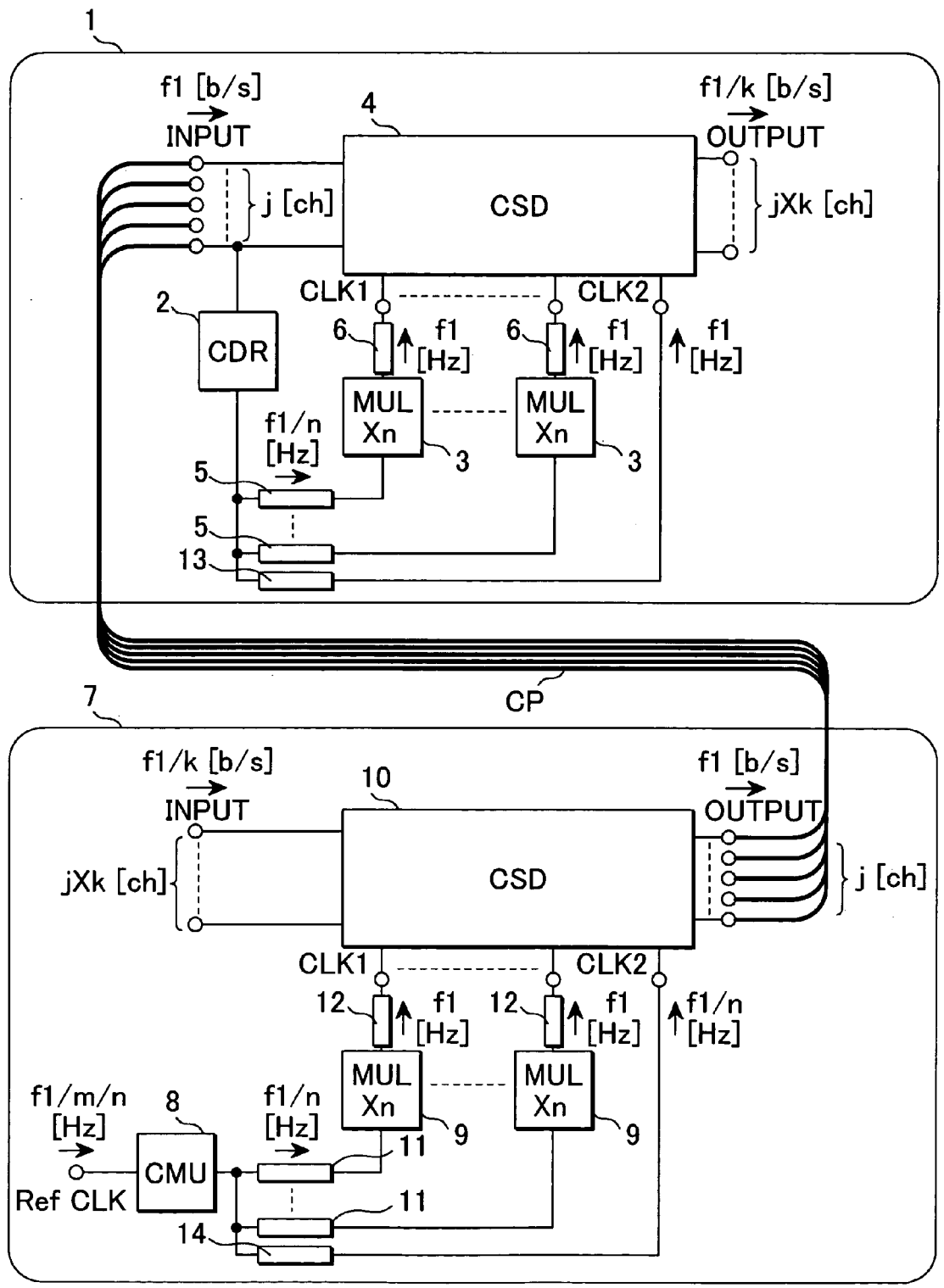
FIG. 1 is a block diagram showing a receiver circuit and a transmitter circuit in a first embodiment of the invention.

FIG. 1 is a circuit diagram showing a first embodiment of a receiver circuit and a transmitter circuit according to the invention. A receiver circuit 1 shown in FIG. 1 is composed of a synchronous circuit (CDR: clock data recovery) 2 that receives "j" pieces of serial data signals of a data rate of f1 b/s, extracts and recovers a clock signal component having a frequency of f1/n Hz (n: two or larger natural number) from one data signal of them, a multiplier (MUL) 3 that multiplies the frequency of the clock signal by "n" and a synchronous digital circuit (CSD) 4 that decides and recovers the input data signals using the multiplied clock signal CLK1 as the criterion of timing.

The output terminal of the synchronous digital circuit 4, that is, the output terminal of the receiver circuit outputs parallel signals of a data rate of f1/k b/s and "j×k" channels acquired by demultiplexing the input serial data signals.

Assuming that interconnect 5 that connects the output terminal of the synchronous circuit 2 and the input terminal of the multiplier 3 makes a delay t1 s and interconnect 6 that connects the output terminal of the multiplier 3 and the clock input terminal of the synchronous digital circuit 4 makes a delay t2 s, respective circuits are arranged in consideration of the delay of the interconnect 6 so that relation between the maximum value t1max of the delay t1 and the maximum value t2max of the delay t2 is "t1max>t2max" and the delay t2max is smaller than the cycle 1/f1 s of the clock signal by one digit or more, that is, is 1/10 or less so as to reduce the effect of the delay 2 of the interconnect 6. The output having the frequency of f1/n Hz of the synchronous circuit 2 via interconnect 13 is input to the synchronous digital circuit 4 as a clock signal CLK2 without passing the multiplier, however, the clock CLK2 is a clock signal for a circuit synchronized and operated at the frequency of f1/n Hz or less such as a circuit for processing demultiplexed parallel signals.

Timing at which the synchronous digital circuit 4 decides and switches data is made only either of a leading edge or a trailing edge of a clock signal by using this configuration because the clock signal of one wavelength corresponds to one code as in full rate operation. Jitter by a time lag between the leading edge and the trailing edge such as that in the above-mentioned half rate operation is not caused. Therefore, a phase margin in which a received signal is decided is larger than that in the half rate operation.

In the meantime, in the conventional type full rate operation, as circuit clocks each of which forms a synchronous circuit and interconnect between them handle an f1 Hz clock signal in addition, some factors that limit a frequency band are caused by a phase control circuit and a clock generation circuit respectively forming the synchronous circuit, interconnect parasitic capacitance and multipoints of interconnect. In the meantime, in the configuration equivalent to this embodiment, as it is only the multiplier 3, a flip-flop to which a clock is input of the synchronous digital circuit 4 and interconnect 6 between them that handle the f1 Hz clock signal which is the highest frequency in the circuit, a factor that limits a frequency band is determined by only the characteristics of devices forming the multiplier and the flip-flop by considering arrangement. Therefore, the data rate of the whole receiver circuit can be enhanced up to the substantially same rate as the maximum operation frequency of the flip flop. Hereby, in the receiver circuit in the configuration equivalent to this embodiment, the operating speed can be enhanced without causing jitter, compared with the conventional type.

For example, when interconnect that connects a circuit block forming the synchronous circuit 2 and the synchronous digital circuit is long, the amplitude of a clock signal attenuates as a result of the decrease of a band by interconnect parasitic capacitance. In case the frequency band of the output terminal of the synchronous circuit 2 is determined by only the resistance and the capacitance and the multiplier 3 is not used in a circuit having the band 40 GHz and the output resistance 20 Ω of the synchronous circuit and the input capacitance 200 fF of the synchronous digital circuit 4, the frequency band is deteriorated up to 20 GHz in case interconnect between them has the interconnect capacitance of 200 fF.

As the high-frequency operation in the vicinity of the frequency band of the circuit is not saturated but is linearly amplified, the amplitude of a 40-GHz clock signal is deteriorated by 7.0 dB.

In the meantime, in case the synchronous circuit 2 is operated by a 20 GHz clock signal and a 40 GHz clock signal is input to the synchronous digital circuit 4 via clock signal interconnect the parasitic capacitance of which is 200 fF using the multiplier 3 equivalent to the double of the clock signal as in the configuration equivalent to this embodiment, the amplitude of the synchronous circuit 2 is deteriorated by only 3.0 dB on the supposition that the clock signal is not attenuated in the multiplier 3. Assuming that the amplitude of a clock signal having the frequency of 1 GHz is 200 mV, the amplitude of the clock signal is 89.3 mV in case no multiplier is used. In the meantime, in case the multiplier is used, the amplitude of the clock signal is 142 mV.

Assuming that the low frequency gain of the synchronous circuit 2 is 30 dB and low-speed noise is input with the amplitude of 3 mV, the noise is 94.9 mV at the input terminal of the flip-flop and in case no multiplier is used, malfunction is caused. In the meantime, in case the multiplier 3 is used, there is an operational margin, the operating frequency is 80 GHz (40 GHz×2) to have the same amplitude as the amplitude of the former and it is clear that the limit of the operating frequency is high.

In the above-mentioned example, the circuit configuration is supposed, however, as the operating frequency of a flip-flop digital circuit is normally higher than the frequency band of linear gain, the similar phenomenon occurs without depending upon the circuit configuration and a value of the above-mentioned example.

Interconnect parasitic capacitance can be ignored by arranging interconnect so that the delay t2 of the interconnect is equivalent to 1/10 or less of the cycle 1/f1 of a clock signal for the following reasons, and the operation up to the operating frequency of the digital circuit is enabled.

As interconnect parasitic capacitance C' can substantially approximate to C/10 if a frequency band determined by the output resistance R of a multiplier and the input capacitance C of a flip-flop is the same angular frequency $\omega 0 = 1/(RC) = 2\pi f1$ as that of a clock signal, the attenuation ratio of the amplitude of the clock signal is expressed as in the following expression (1), is maximum 5% and interconnect is a main factor that determines a frequency band no longer. The output resistance R of the multiplier can be optimized by applying the similar circuit to a clock buffer to an output buffer.

$$\sqrt{\frac{\frac{1}{1+(1.1RC\omega 0)^2}}{\frac{1}{1+(RC\omega 0)^2}}} \cong \sqrt{\frac{1^2}{1.1^2}} = 0.901 \left( \text{when } \omega 0 = \frac{1}{RC} \right) \quad (1)$$

Compared with a clock signal having a frequency of f1 Hz is required to be handled by the circuit blocks forming the synchronous circuit and the interconnect between them in the above-mentioned conventional type full rate operation, the operation frequency of the synchronous circuit can be reduced up to 1/n in the configuration equivalent to this embodiment and another circuit characteristic having the relation of trade-off with a frequency band can be enhanced. For example, the enhancement of drivability, the reduction of power consumption, the enhancement of a synchronizing frequency range and the reduction of phase noise can be given.

"j×k" channels of serial data signals the data rate of which is f1/k b/s are input to a transmitter circuit 7 shown in FIG. 1 in parallel, a reference clock signal CLK synchronized with the data signal and having a frequency of f1/m/n Hz is also input to the transmitter circuit and the transmitter circuit outputs "j" channels of data signals the data rate of which is f1 b/s.

The transmitter circuit 7 is composed of a clock control circuit (CMU: clock multiplier unit) 8 that outputs a clock signal synchronized with a reference clock RefCLK and having a frequency, f1/n Hz of "m" times, multipliers 9 each of which multiplies a clock signal having a frequency f1 Hz of "n" times by the output and a synchronous digital circuit 10 that performs time division multiplexing and waveform reshaping using the multiplied clock signal CLK1 as a criterion of timing and outputs "j" channels of data signals the data rate of which is f1 b/s, and the output of the synchronous digital circuit 10 is transmitted to the input terminal of the receiver circuit 1 via a communication path CP such as an optical fiber as the output of the transmitter circuit 7. The output of a frequency f1/n Hz of the synchronous circuit 8 via interconnect 14 is input to the synchronous digital circuit 10 without passing the multiplier as a clock signal CLK2, however, this clock CLK2 is a clock signal for a circuit synchronized at a frequency of f1/n Hz or less and operated like a circuit for processing parallel signals before multiplexing.

Assuming that also in the transmitter circuit 7, as in the receiver circuit 1, delay t1 s occurs on interconnect 11 connecting the output terminal of the clock control circuit 8 and the input terminal of the multiplier 9 and delay t2 s occurs on interconnect 12 connecting the output terminal of the multiplier 9 and the input terminal of a flip-flop, the respective circuits are arranged so that relation between the maximum value t1max of the delay t1 and the maximum value t2max of the delay t2 is "t1max>t2max" and the maximum value t2max of the delay t2 is equivalent to 1/10 or less of the cycle 1/f1 s of a clock signal.

Timing at which the synchronous digital circuit 10 outputs and shapes data signals is made only either of a leading edge or a trailing edge of a clock signal by using this configuration as in the receiver circuit 1 because a clock signal of one wavelength corresponds to one code. Jitter by time lag between the leading edge and the trailing edge which is caused in the above-mentioned half rate operation is not caused. Therefore, jitter which occurs in the waveform of a transmitted signal is smaller than that in the half rate operation.

In the conventional type full rate operation, as the circuit blocks forming the synchronous circuit and the interconnect between them handle a clock signal having a frequency of f1 Hz, a frequency band is limited by the phase control circuit and the clock generation circuit respectively forming the synchronous circuit and multipoints of the interconnect in addition. In the meantime, in the configuration equivalent to this embodiment, as it is only the multiplier 9, the flip-flop to which a clock is input of the synchronous digital circuit 10 and interconnect connecting them that handle a clock signal of f1 Hz which is the highest frequency in the circuit, there are few factors that limit a frequency band. The decrease of a band by interconnect is reduced by arranging the interconnect so that the delay t2 of the interconnect is equivalent to 1/10 or less of the cycle 1/f1 of a clock signal, and is determined by the characteristics of the multiplier and a device forming the flip-flop. As a circuit of the output of the multipliers can be optimized, the data rate of the transmitter circuit can be enhanced up to the substantially maximum operation frequency of the flip-flop. Therefore, the transmitter circuit according to the invention has less jitter, compared with the conventional type and the operation frequency can be enhanced.

Besides, compared with the conventional type full rate operation in which the circuit blocks forming the synchronous circuit and the interconnect between them are required to handle a clock signal having a frequency of f1 Hz, the operation frequency of the synchronous circuit can be reduced up to 1/n, and the enhancement of drivability, the reduction of power consumption, the enhancement of a synchronizing frequency range and the reduction of phase noise respectively having the relation of trade-off with a frequency band can be realized.

Figure 2:
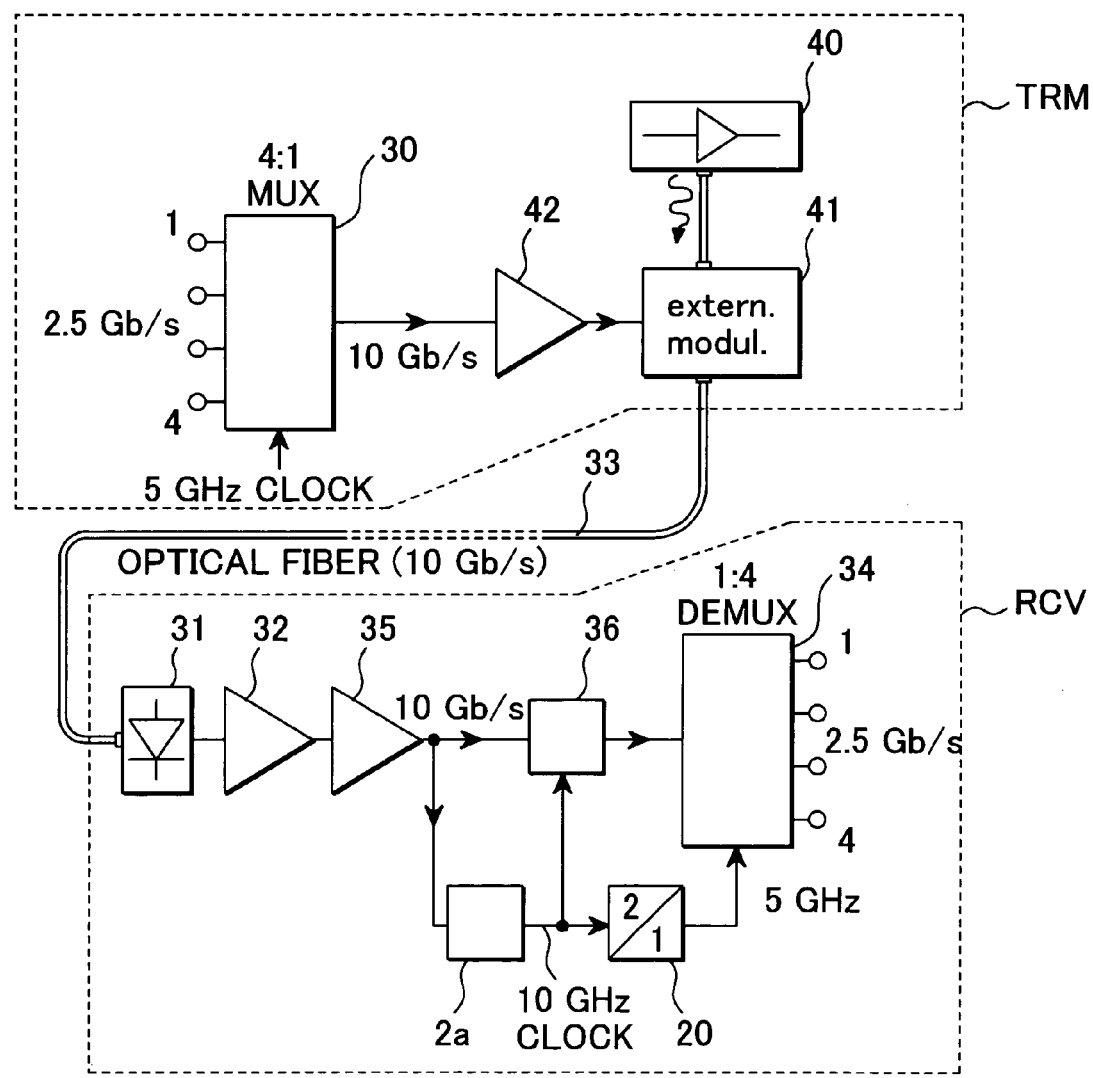
FIG. 2 is a block diagram showing a conventional type receiver circuit and a conventional type transmitter circuit.
Figure 3:
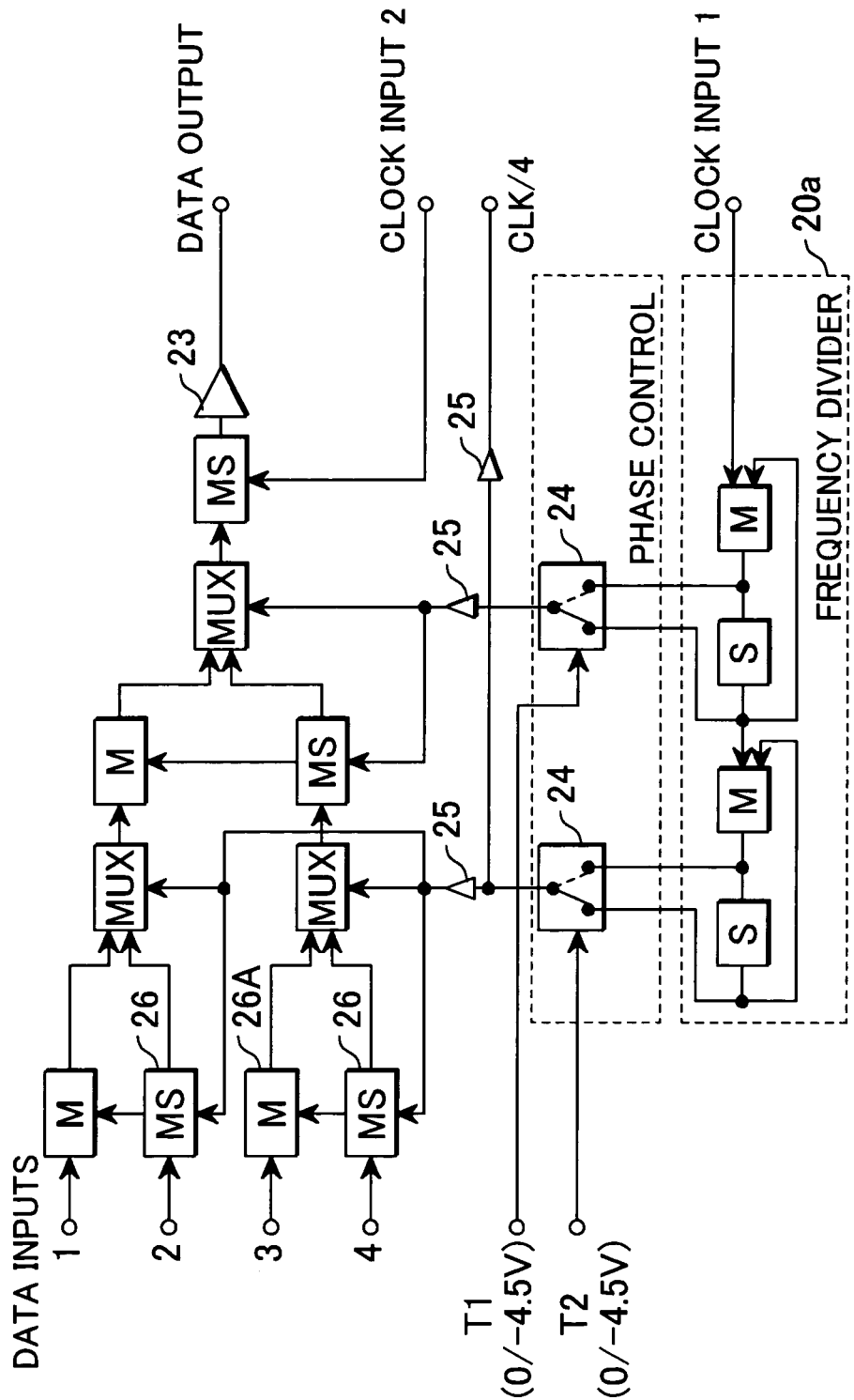
FIG. 3 is a block diagram showing a transmitter circuit in conventional type full rate operation.
Figure 4:
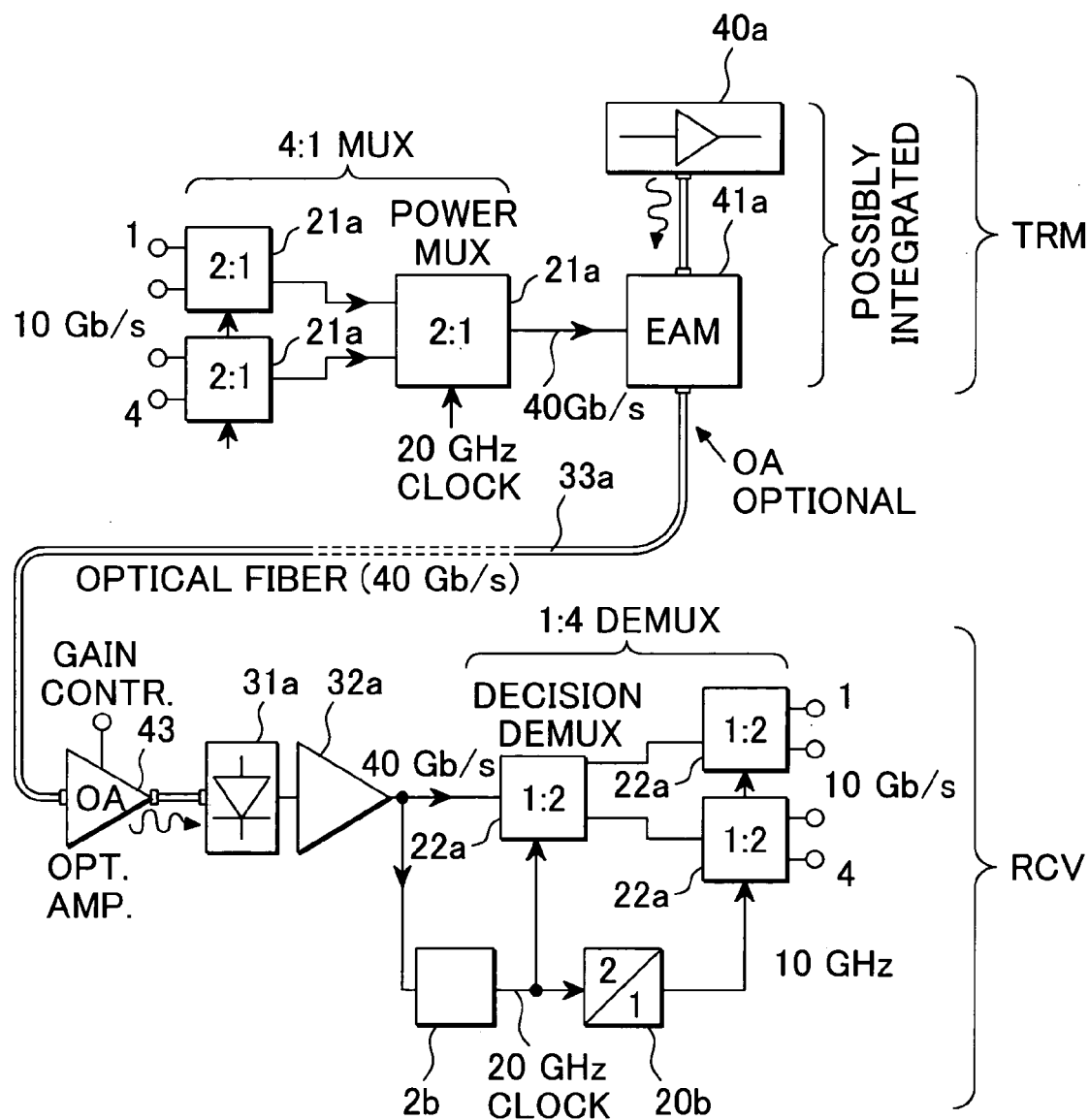
FIG. 4 is a block diagram showing a receiver circuit and a transmitter circuit respectively in conventional type half rate operation.

In case the receiver circuit and the transmitter circuit communicate by an optical signal using an optical fiber for a communication path CP, photo diodes of the number corresponding to the number of optical fibers for converting an optical signal to an electrical signal and preamplifiers of the same number as the number of the photo diodes for amplifying a signal of each photo diode have only to be provided to an input part of the receiver circuit 1 as shown in FIG. 2 equivalent to the conventional type example 1 though the photo diodes and the preamplifiers are not shown in FIG. 1 and besides, the output of each preamplifier has only to be input for a data signal. Besides, as shown in FIG. 2 equivalent to the conventional type example 1, a driver for amplifying the output of a data signal, a laser oscillator that generates an optical signal and a modulator that outputs a modulated signal acquired by modulating the optical signal according to a modulating signal output from the driver have only to be provided to an output part of the transmitter circuit 7. In the following embodiments, in case an optical signal is used, the similar action is also required.

<Second Embodiment>

Figure 5:
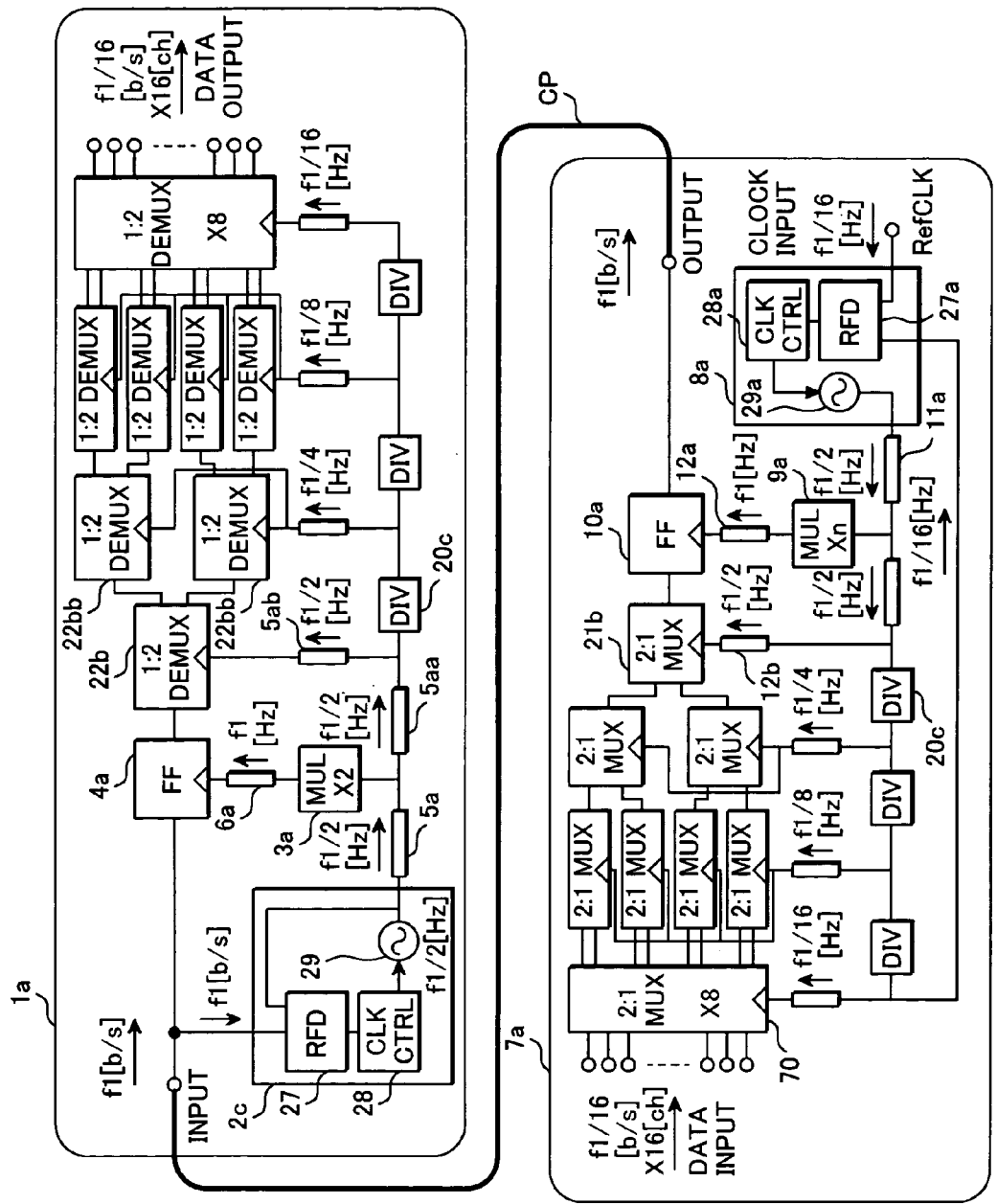
FIG. 5 is a block diagram showing a receiver circuit and a transmitter circuit in a second embodiment of the invention.

FIG. 5 is a circuit diagram showing a second embodiment of the receiver circuit and the transmitter circuit according to the invention.

A circuit equivalent to this embodiment is a transceiver circuit that performs the time division multiplexing of "k:1" based upon "k" pieces of parallel signals, transmits data the data rate of which is f1 b/s on one transmission line and can demultiplex and recover a time-division multiplexed signal in "1:k" again. In FIG. 5 and the following description, a case of "k=16" is given for an example, however, it need scarcely be said that "k" may be also 2 or a larger natural number.

In shown in FIG. 5, a receiver circuit (RCV) 1a is composed of a synchronous circuit 2c that receives a serial data signal the data rate of which is f1 b/s, recovers and outputs a clock based upon the data signal, a multiplier 3a, a flip-flop for decision 4a that decides and recovers the data signal, a demultiplexer (DEMUX) 22b that performs the demultiplexing of "1:2" and frequency dividers (DIV) 20c that output clock signals having each frequency of 1/2, 1/4, 1/8, 1/16 required for the demultiplexer 22b.

The input data signal is input with it branched to the synchronous circuit 2c and the flip-flop for decision 4a.

The synchronous circuit 2c is a phase locked loop (PLL) composed of a phase/frequency comparator (PFD) 27 that outputs phase difference and frequency difference between the input data signal and a clock signal, a clock control circuit (CLK_CTRL) 28 that outputs a control signal based upon a transfer function based upon the output of the phase/frequency comparator over a clock frequency and a variable frequency oscillator 29 that outputs a clock signal CLK. In this case, the PLL is shown for one example of the synchronous circuit 2c, however, another type known as PLL and a circuit known as a clock extracting circuit except PLL can be used.

Concerning the data signal input to the synchronous circuit 2c, phase difference and frequency difference with a clock signal are detected, and a frequency and a phase of the variable frequency oscillator 29 are changed corresponding to the values. When the data signal and a clock signal are synchronous, a clock frequency is locked at f1/2 Hz. The condition of an unlocked phase and an unlocked frequency is determined by the transfer function of the clock control circuit 28.

The PLL can be precisely synchronized with a data signal, however, as the circuit configuration is complex and the design of a high-precision analog circuit such as the variable frequency circuit is required, it is difficult to operate PLL at a frequency f1 similar to a digital circuit the frequency of which is the highest in the circuit. Therefore, when the PLL is operated at a low frequency of f1/2 Hz, a condition of the rate is relieved, and the increase of variable frequencies, the reduction of phase noise and the reduction of power consumption can be realized.

A clock signal CLK is transmitted to a multiplier 3a via interconnect 5a, to the frequency divider 20c via the interconnects 5a, 5aa and to the 1:2 demultiplexer 22b via interconnects 5a, 5aa, 5ab. In the multiplier 3a, the clock signal is converted to a clock signal having a frequency of f1 Hz and in the flip-flop 4a, the data signal is decided and recovered at suitable timing. Decision in which jitter hardly occurs is enabled by deciding using the clock signal having the frequency of f1 Hz and a phase margin can be increased.

The decided and recovered data signal is input to the demultiplexer 22b and is time-division demultiplexed into two signals of f1/2 b/s at the timing of a clock signal having a frequency of f1/2 Hz. Further, the demultiplexed two signals are input to the next 1:2 demultiplexers 22bb and are demultiplexed into four data signals the data rate of which is f1/4 b/s according to the timing of a clock signal having a frequency of f1/4 Hz acquired by making the clock signal having the frequency of f1/2 Hz pass the next frequency divider 20c.

Similarly, the data signal is demultiplexed into 8 pieces of f1/8 b/s and into 16 pieces of f1/16 b/s by the 1:2 demultiplexers connected in tree structure and 16 channels of output can be acquired from the receiver circuit 1a.

A transmitter circuit 7a is composed of a synchronous circuit 8a that receives 16 pieces of parallel data signals the data rate of which is f1/16 b/s and a reference clock signal RefCLK the frequency of which is f1/16 Hz and outputs a clock signal having a frequency of f1/2 Hz, a multiplier 9a that multiplies the clock signal having the frequency of f1/2 Hz by "n", a flip-flop 10a that shapes the output waveform of the data signals, multiplexers 21b that perform the time division multiplexing of "2:1" and frequency dividers 20c that output clock signals having each frequency of 1/2, 1/4, 1/8, 1/16 required for the multiplexers 21b.

For the reference clock signal RefCLK, a low-speed clock signal used in an external circuit is input. To acquire a high-precision clock signal used inside the transmitter circuit such as frequencies f1 Hz and f1/2 Hz, a synchronous circuit using PLL is used. The PLL in this case has the similar circuit configuration to that of the receiver circuit, however, it is one example.

The synchronous circuit 8a compares a phase of the reference clock signal RefCLK and a phase of a clock signal having a frequency of f1/16 Hz acquired by dividing the frequency of an output clock signal the frequency of which is f1/2 Hz in 1/8. The synchronous circuit controls the frequency of the variable frequency oscillator 29a corresponding to phase difference and outputs a clock signal synchronized with a reference frequency f1/2 Hz. As in the receiver circuit, the increase of variable frequencies, the reduction of phase noise and the reduction of power consumption can be realized by setting the operating frequency to f1/2 Hz.

The clock signal output from the synchronous circuit 8a is input to the multiplier 9a via interconnect 11a, to the frequency dividers 20c via interconnects 11a, 11b and further, to the 2:1 multiplexers 21b via interconnects 11a, 11b, 12b.

Data signals input to the transmitter circuit 7a are input to a circuit 70 in which eight 2:1 multiplexers (MUX) are arranged and are time-division multiplexed into eight parallel data signals the data rate of which is f1/8 b/s at the timing of a clock signal having a frequency of f1/16 Hz output based upon the clock signal having the frequency of f1/2 Hz via the three frequency dividers 20c.

Similarly, the eight parallel data signals are time-division multiplexed into a serial data signal from the data rate of f1/4 b/s to the data rate of f1 b/s via f1/2 b/s by the 2:1 multiplexers (MUX) connected in tree structure at the timing of respective clock signals having each frequency of f1/8 Hz, f1/4 Hz, f1/2 Hz. A clock signal having the frequency of f1/2 Hz input to the multiplier 9a is input to the flip-flop 10a that shapes the waveform of the output data signal the data rate of which is f1 b/s via the interconnect 12a as a clock signal having the frequency of f1 Hz. The waveform having little jitter can be output by switching according to a clock signal having the frequency of f1 Hz, and the reduction of a communication error and the extension of a communication range can be realized.

<Third Embodiment>

Figure 6:
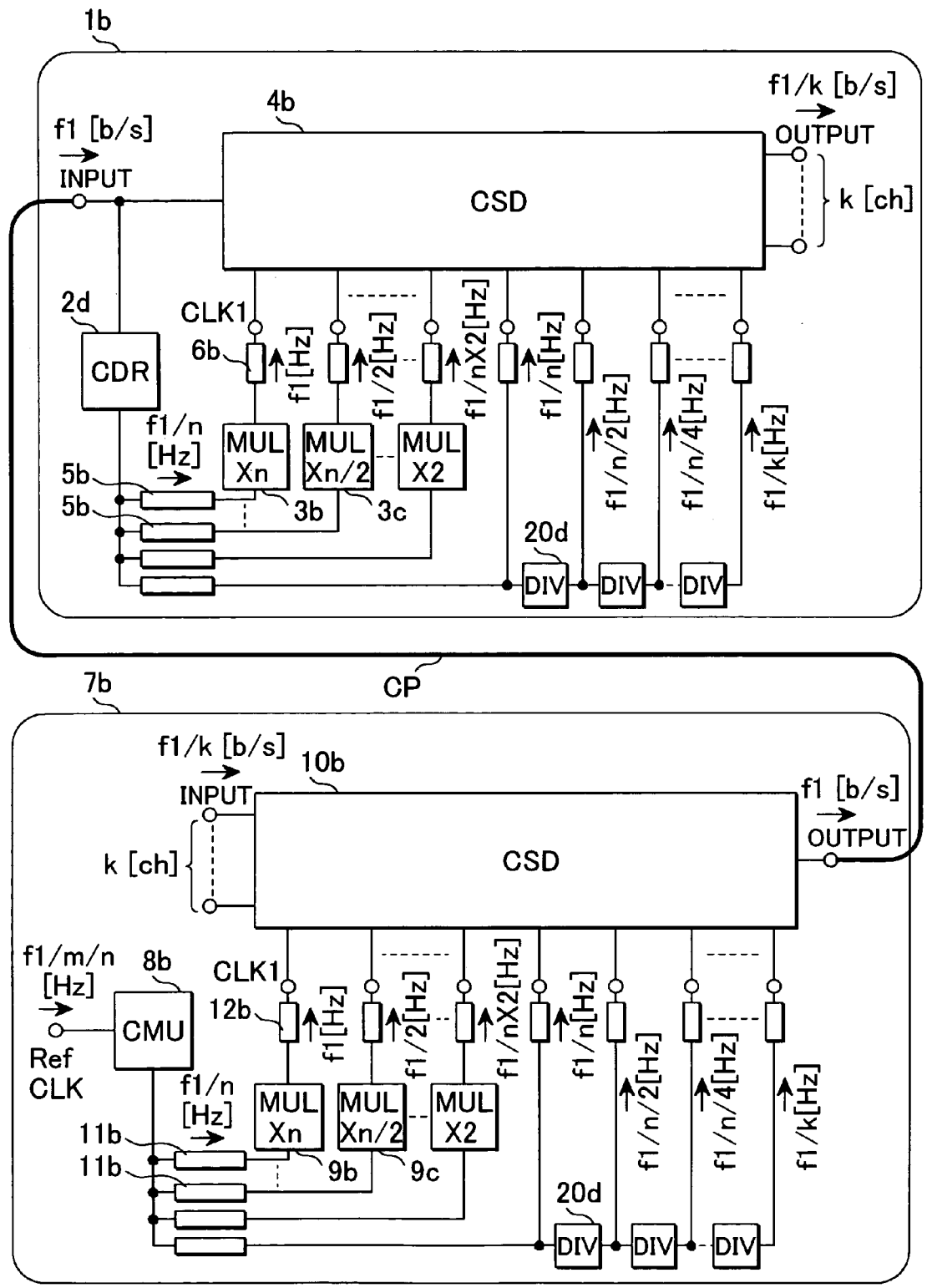
FIG. 6 is a block diagram showing a receiver circuit and a transmitter circuit in a third embodiment of the invention.

FIG. 6 is a circuit diagram showing a third embodiment of the receiver circuit and the transmitter circuit according to the invention.

This embodiment is different from the first embodiment shown in FIG. 1 in configuration in which a clock signal is distributed. A clock signal having a frequency of f1/n Hz and output from respective synchronous circuits 2d, 8b in a receiver circuit 1b and a transmitter circuit 7b is respectively branched and is input to multipliers 3b, 9b that output a clock signal having a frequency of "n" times via interconnects 5b, 11b and multipliers 3c, - - - , 9c, - - - that similarly output that output frequencies of n/2 times, n/4 times, - - - , f1/n×2 times.

Besides, the clock signal is input to each frequency divider 20d that outputs a half frequency, the output is cascaded and frequencies of f1/n/2 Hz, f1/n/4 Hz, - - - , f1/k Hz are output. Clock signals respectively output from the multipliers, the frequency dividers and the synchronous circuits are input to respective synchronous digital circuits 4b, 10b.

All clock frequencies required for the transceiver circuit that multiplexes parallel signals and demultiplexes into parallel signals can be acquired by configuring the transceiver circuit so that a clock signal acquired by dividing the frequency of f1 Hz in the "N"th power of 2 (N: natural number) is distributed as described above. The configuration using the multipliers for distributing a clock can reduce the number of devices operated at a high frequency equal to or exceeding f1/n Hz, compared with the configuration including only frequency dividers, and not only the enhancement of the operating frequency but the reduction of power consumption can be realized.

Examples of each concrete circuit configuration of the 2:1 multiplexers, the 1:2 demultiplexers, the 1/2 frequency dividers and the multipliers used in the receiver circuit and the transmitter circuit according to the invention described not only in this embodiment but in the above-mentioned first and second embodiments will be described below.

(I) 2:1 Multiplexer

Figure 7:
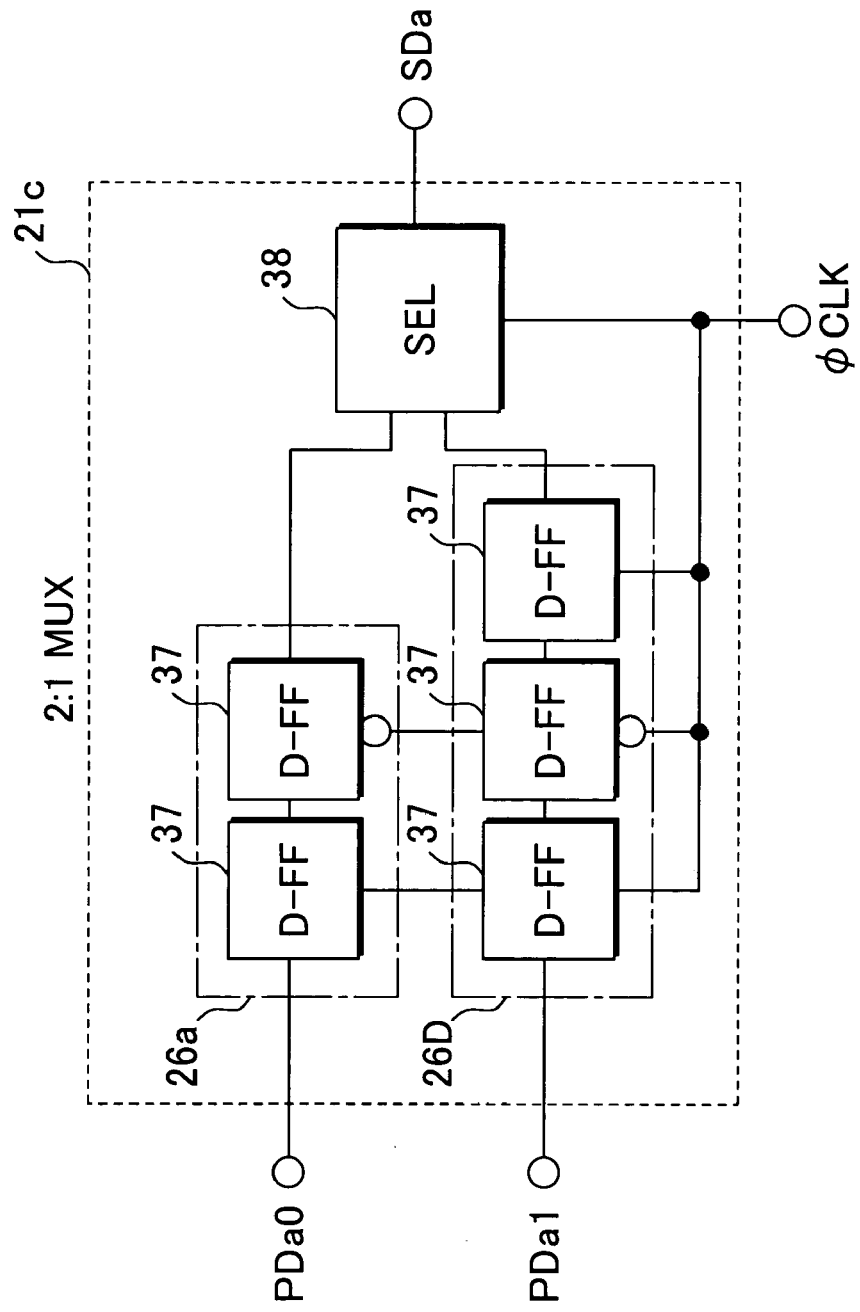
FIG. 7 is a block diagram showing one example of a multiplexer used in the receiver circuit and the transmitter circuit according to the invention.

FIG. 7 is a block diagram showing the internal configuration of the 2:1 multiplexer. The 2:1 multiplexer (2:1 MUX) is composed of a serial connection circuit 26a in which two D flip-flops 37 operated at a normal phase and at a reverse phase of a clock signal φCL are serially connected, a serial connection circuit 26D in which three D flip-flops 37 operated at the normal phase and at the reverse phase of the same clock signal φCL are serially connected in the order of the normal phase, the reverse phase and the normal phase and a selector 38.

A data signal PDa0 out of two parallel data input signals PDa0, PDa1 is input to one terminal of the selector 38 via the serial connection circuit 26a, and the other data signal PDa1 is input to the other terminal of the selector 38 via the serial connection circuit 26D. As the data PDa1 is output behind the data PDa0 by a half cycle owing to this configuration, it is input at the same timing as the timing of the switching of the selector 38. For a signal SDa output from the selector 38', the input data PDa0 is selected at the normal phase of the clock signal φCL, the input data PDa1 is selected at the reverse phase, they are serially output every half cycle, that is, at a double data rate and time division multiplexing is performed. As a waveform output in this circuit is switched at both timing of a leading edge and a trailing edge of the clock signal φCL, only clock frequencies equivalent to a half of a cycle of an output signal of the serial data SDa are required though jitter occurs. As jitter caused in a signal output from the flip-flops at a first stage is shaped in a timing margin of the flip-flops connected next, jitter is small and high-speed operation is enabled.

(II) 1:2 Demultiplexer

Figure 8:
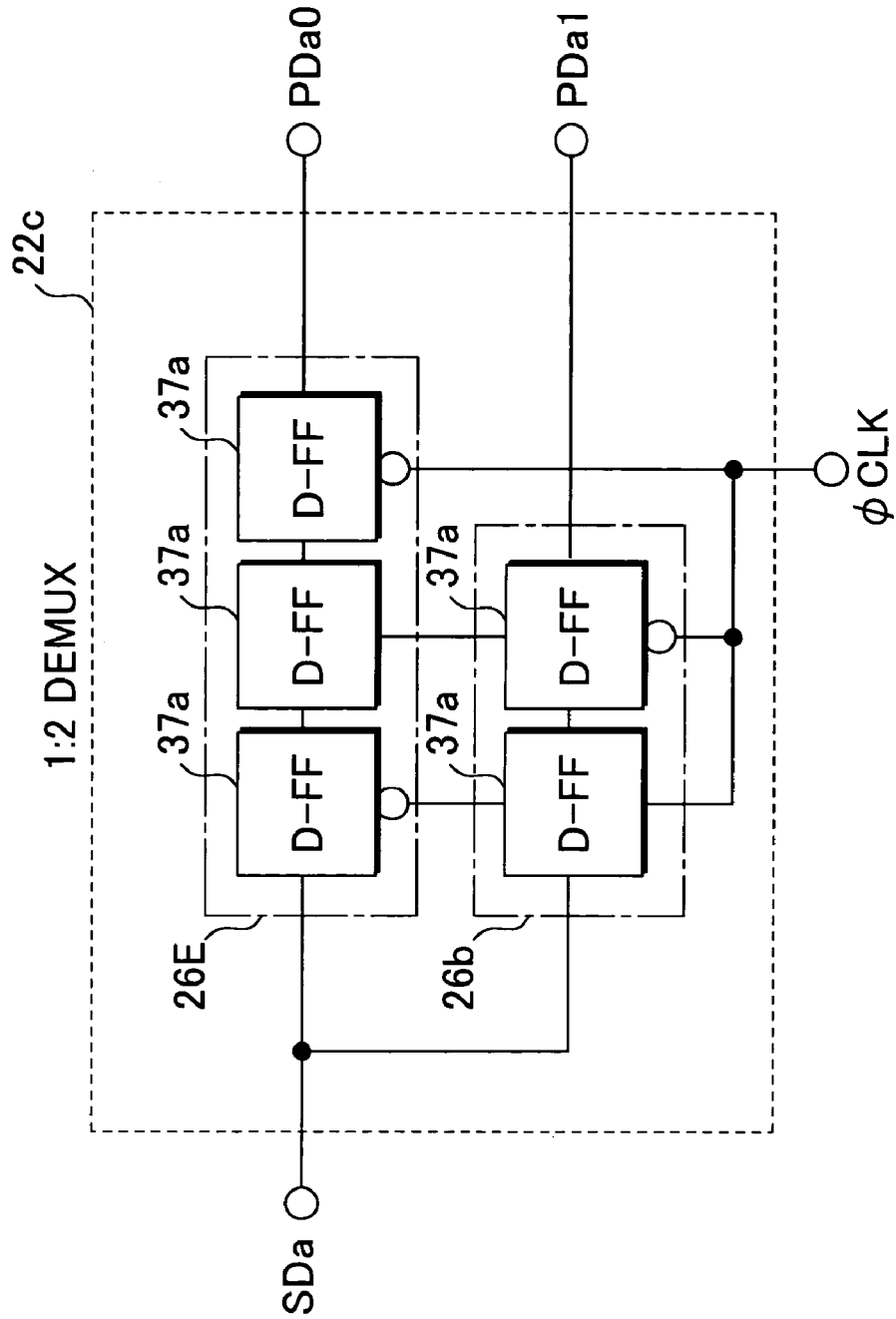
FIG. 8 is a block diagram showing one example of a demultiplexer used in the receiver circuit and the transmitter circuit according to the invention.

FIG. 8 is a block diagram showing the internal configuration of the 1:2 demultiplexer (1:2 DEMUX). The 1:2 demultiplexer is composed of a serial connection circuit 26E in an upper row in which three D flip-flops 37 operated at the normal phase and at the reverse phase of the same clock signal φCL are connected in the order of the reverse phase, the normal phase and the reverse phase and a serial connection circuit 26b in a lower row in which two D flip-flops 37 operated at the normal phase and the reverse phase of the clock signal φCL are connected.

A serial data signal SDa is input to a D flip-flop 37a in a first column operated at the reverse phase in the serial connection circuit 26E and a D flip-flop 37a in the first column operated at the normal phase of the clock signal in the serial connection circuit 26b. The serial data signal is alternately input to the D flip-flop in the upper row and to the D flip-flop in the lower row every half cycle of the clock signal φCL. The data signals in respective rows are input to D flip-flops 37a in the next column operated behind a half cycle, and only in the upper row, the data signal is input to a D flip-flop 37a in the final column operated further behind a half cycle. Therefore, the output of the D flip-flops in the final column is performed at the same timing both in the upper row and in the lower row. In this circuit, the frequency of the input clock signal φCL is also equivalent to a half of the cycle of the serial data signal SDa demultiplexed in "1:2".

(III) 1/2 Frequency Divider

Figure 9:
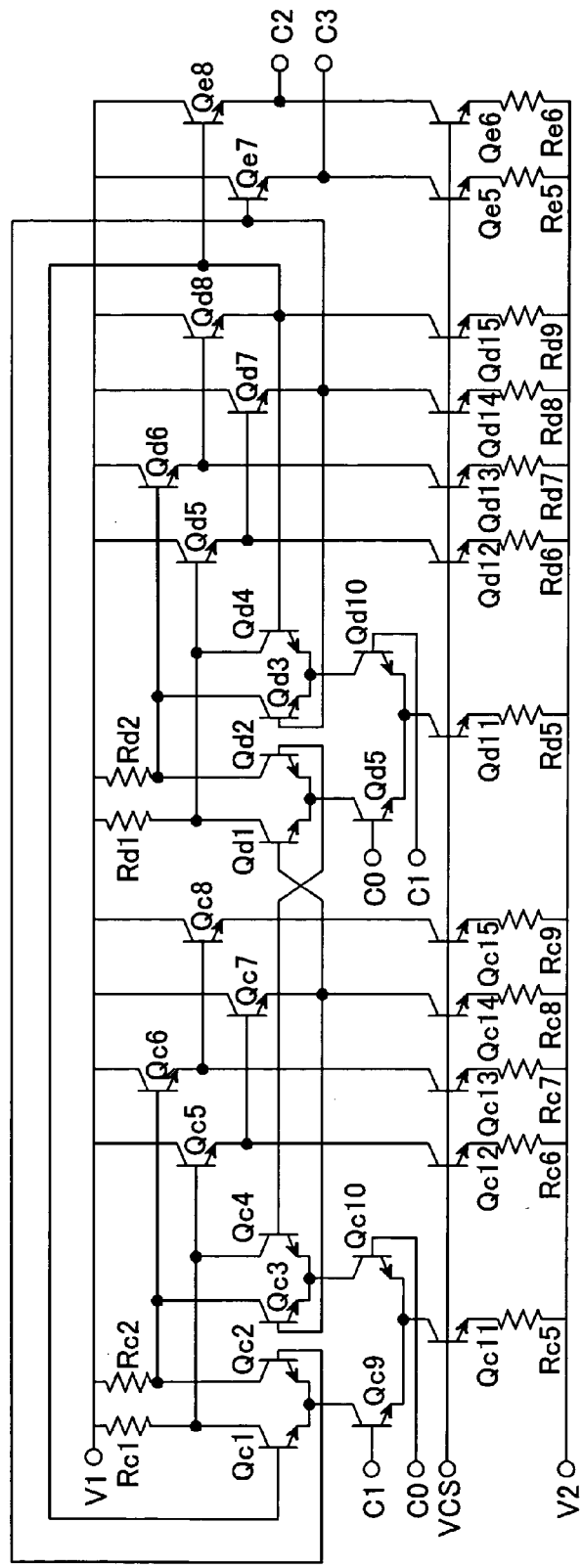
FIG. 9 is a block diagram showing one example of the configuration of a frequency divider used in the receiver circuit and the transmitter circuit according to the invention.

FIG. 9 shows a circuit widely known as a 1/2 frequency divider. In the circuit shown in FIG. 9, a left-hand circuit composed of transistors Qc1 to Qc15 and resistors Rc1 to Rc9 forms a D flip-flop. Similarly, a right-hand circuit composed of transistors Qd1 to Qd15 and resistors Rd1 to Rd9 forms a D flip-flop in which the input/output of data and the input of a clock are reversed to those in the left-hand circuit.

Transistors Qe5 to Qe8 and resistors Re5, Re6 form an emitter follower for acquiring an output signal. The transistors Qc5 to Qc8 inside the D flip-flop and Qd5 to Qd8 of the emitter follower are not required to be arranged at two stages, and the transistors can also have configuration at one stage according to demands for an operation frequency and power consumption and the configuration of current mode logic (CML) in which no emitter follower is used. An emitter follower for output of the transistors Qe7, Qe8 is also similar.

Figure 10:
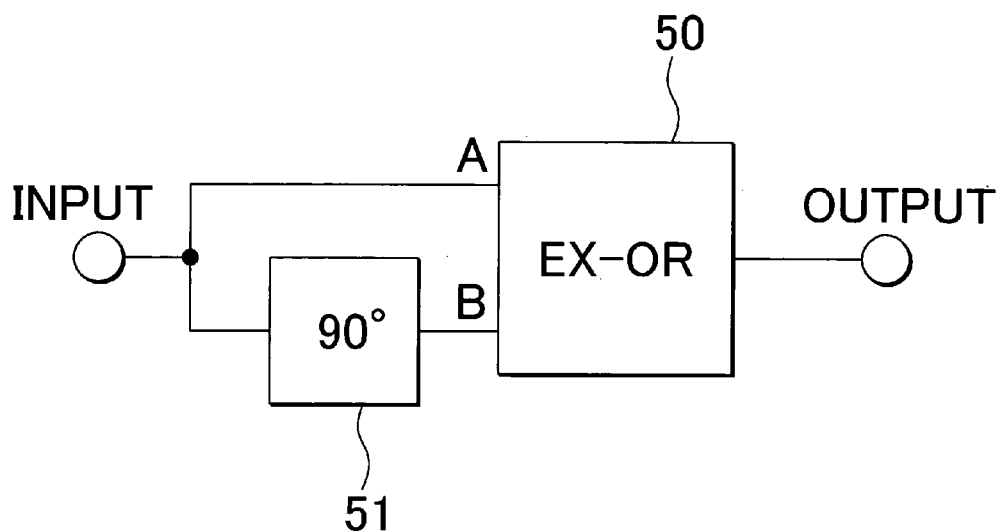
FIG. 10 is a block diagram showing one example of the configuration of a multiplier circuit used in the receiver circuit and the transmitter circuit according to the invention.

(IV) Multiplier (IV-1) FIG. 10 shows a first example of the configuration of the multiplier and is a block diagram in case the multiplier is formed by an exclusive-OR circuit (EX-OR) 50 and a 90-degree phase shifter 51.

A signal input to the multiplier is branched in two, one is directly input to an input terminal A of the exclusive-OR circuit 50, the other is input to the 90-degree phase shifter 51 and a signal the phase of which is shifted by 90 degrees is input to an input terminal B of the exclusive-OR circuit 50.

In case the input signal is a digital signal and has a repetitive waveform of a code 1 and a code 0, input A is 1 and input B is 0 while the phase is 0° to 90°, and output is 1. While the phase is 90° to 180°, the input A is 1, the input B is 1 and the output is 0. Similarly, while the phase is 180° to 270°, the output is 1 and while the phase is 270° to 360°, the output is 0. Therefore, as a signal is output twice for one cycle of an input signal, an output signal has a cycle of 1/2.

Similarly, even if an input signal is an analog sine wave, a signal having a double frequency is output. Therefore, the circuit shown in FIG. 10 functions as a double multiplier. In the case of this circuit block configuration, a multiplied signal is acquired without depending upon a frequency in operation according to a principle.

Figure 11:
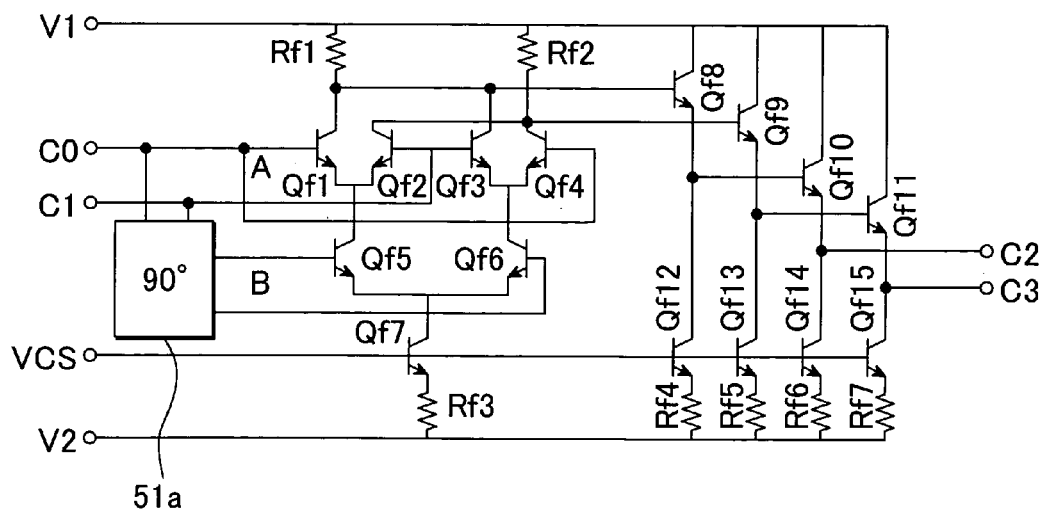
FIG. 11 is a block diagram showing another example of the configuration of the multiplier circuit used in the receiver circuit and the transmitter circuit according to the invention.

(IV-2) FIG. 11 shows circuit configuration in case Gilbert circuit is used for the exclusive-OR circuit 50 in the above-mentioned first example of the configuration of the multiplier.

Suppose that when a differential signal (C0–C1) between input terminals C0 and C1 is positive, it is in a normal phase, when the differential signal is negative, it is in a reverse phase and a signal input to the base of differential pair transistors Qf1, Qf2 and the base of differential pair transistors Qf3; Qf4 is input A. Besides, similarly for the differential output of the 90-degree phase shifter 51*a*, suppose that when the differential output is positive, it is in a normal phase, when the differential output is negative, it is in a reverse phase and a signal input to the base of differential pair transistors Qf5, Qf6 is input B.

When the input A is in a normal phase and the input B is in a reverse phase, current flows into a resistor Rf2 and the transistors Qf4, Qf6 and differential output (C2–C3) between output terminals C2, C3 is in a normal phase.

When the input A is in a normal phase and the input B is in a normal phase, current flows into a resistor Rf1 and the transistors Qf1, Qf5 and differential output (C2–C3) between the output terminals C2, C3 is in a reverse phase.

Similarly, when the input A is in a reverse phase and the input B is in a normal phase, the differential output (C2–C3) is in a normal phase and when the input A is in a reverse phase and the input B is in a reverse phase, the differential output (C2–C3) is in a reverse phase.

Therefore, the output of exclusive OR can be acquired by this circuit configuration. Besides, for the multiplier, as described above, a signal of a double frequency as the differential output (C2–C3) can be also acquired. In FIG. 11, V1 denotes power supply voltage on the high voltage side, V2 denotes power supply voltage on the low voltage side, VCS denotes control voltage applied to the bases of transistors Qf7, Qfl2 to Qfl5 for a current source, Rf1 and Rf2 denote load resistance and Rf3 to Rf7 denote resistance that decides a current value.

Figure 12:
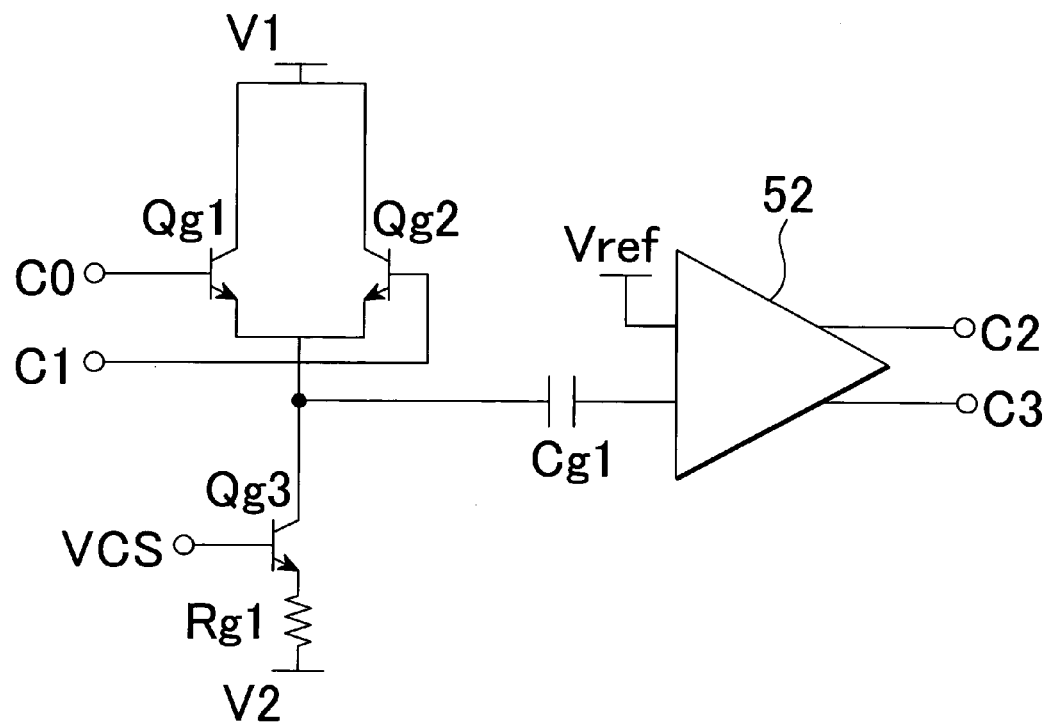
FIG. 12 is a block diagram showing further another example of the configuration of the multiplier circuit used in the receiver circuit and the transmitter circuit according to the invention.

(IV-3) FIG. 12 shows a second example of the configuration of the multiplier and shows circuit configuration in case a full wave rectifier is used. Concerning a wave form output from the full wave rectifier, in the case of a sine wave, a signal having a half cycle of an input signal folded using a central value as a criterion is output and a signal of a double frequency is acquired by removing a harmonic component.

In FIG. 12, the full wave rectifier circuit is formed by differential pair transistors Qg1, Qg2 having a common emitter and a common collector, to remove a D.C. component of an output signal, a capacitor Cg is connected to an output terminal in series and further, for single to differential conversion, an amplifier 52 is connected. Amplitude attenuated by the full wave rectifier circuit can be recovered by the amplifier 52.

The configuration of the multiplier has advantages that the configuration is smaller in a circuit scale, compared with the configuration shown in FIG. 11 and power consumption can be reduced.

Figure 13:
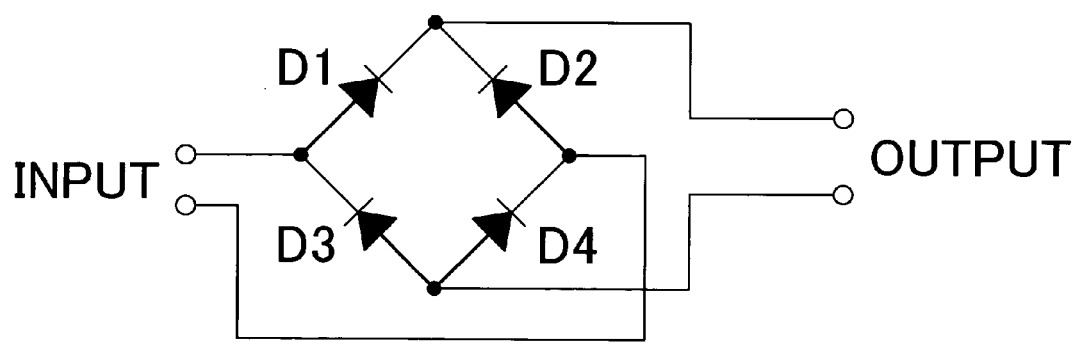
FIG. 13 is a block diagram showing the other example of the configuration of the multiplier circuit used in the receiver circuit and the transmitter circuit according to the invention.

(IV-4) FIG. 13 shows a third example of the configuration of the multiplier and shows circuit configuration in case a diode bridge is used.

A diode bridge formed by diodes D1 to D4 is also known as a full wave rectifier circuit and the diode bridge functions as a multiplier the frequency of which is double by connecting an amplifier to an output terminal via a capacitor as in the second example shown in FIG. 12.

The configuration of this multiplier is configuration having the least power consumption if the power consumption of the amplifier is equal to that in FIG. 12.

The receiver circuit and the transmitter circuit according to the invention can be realized by using each circuit described in above (I) to (IV-4) in the corresponding circuits of this embodiment and the first and second embodiments.

The preferred embodiments of the invention have been described, however, the invention is not limited to the above-mentioned embodiments and it need scarcely be said that various design changes can be made in a range that does not deviate from the concept of the invention. For example, in the embodiments as an example of concrete circuit configuration, only the case that the bipolar transistor is used is described, however, needless to say, in place of the bipolar transistor, a field effect transistor, a heterojunction bipolar transistor, a high electron mobility transistor and a metal oxide semiconductor field effect transistor may be also used, and it need scarcely be said that the transmission system of a data signal and a clock signal can be applied in both cases of a differential type and a single type.

EFFECT OF THE INVENTION

As clear from the above-mentioned embodiments, according to the invention, as the synchronous circuit is synchronized with an input signal and can greatly reduce a frequency of an output clock signal, the problem that the frequency of the clock signal exceeds the frequency band of the synchronous circuit, the amplitude of the clock signal attenuates and the synchronous digital circuit cannot be operated is solved. That is, the operating frequency band of the synchronous circuit does not limit the operation frequency of the transceiver circuit. Therefore, a transceiver circuit of a further high operating frequency can be designed up to a frequency at which a synchronous digital circuit can be operated.

Besides, as the operating frequency of the synchronous circuit which was a circuit the power consumption of which was large in the transceiver circuit to acquire a high operating frequency in the conventional type is reduced according to the invention, operating current can be more greatly reduced than that in the conventional type and power consumption can be reduced.

Besides, as a frequency oscillated by the variable frequency oscillator used for the synchronous circuit can be reduced, compared with that in the conventional type, effect by a parasitic element is reduced, and the enhancement of design precision, the extension of a variable frequency range and the reduction of the phase noise of the oscillator can be realized.

Besides, as the operating frequency of the synchronous circuit is reduced, the effect of interconnect capacitance caused on the interconnect of a clock signal is reduced and as a result, the interconnect can be extended in inverse proportion to the reduction of the frequency.

What is claimed is:

1. A receiver circuit, comprising:
    a synchronous circuit that recovers and outputs a clock signal having a frequency of f1/n Hz (n:2 or larger natural number) synchronized with input one data signal the data rate of which is f1 b/s (f1: positive real number);
    "j" pieces of multipliers that output each clock signal acquired by multiplying a clock signal output from the synchronous circuit by predetermined multiple ratio via "j" pieces of interconnects (j: one or larger natural number); and a synchronous digital circuit that has "j" pieces of parallel input terminals including one common to the input of the synchronous circuit, "j×k" pieces of parallel output terminals and "j" pieces of parallel clock input terminals, decides and recovers "j" pieces of data signals the data rate of each of which is f1 b/s and which are input to the "j" pieces of parallel input terminals using the "j" pieces of multiplied clock signals applied to the "j" pieces of parallel clock input terminals via (j+1) th to (2×j) th interconnects as a criterion of timing, demultiplexes the data in the ratio of "1:k" and converts to "j×k" pieces of data signals the data rate of each of which is f1/k b/s, wherein:

the "j" pieces of parallel terminals to which data signals are input of the synchronous digital circuit function as the input terminal of the receiver circuit and the "j×k" pieces of parallel terminals from which the data signals are output function as the output terminal of the receiver circuit; and first to "j"th interconnects connecting the output. terminal of the synchronous circuit and the input terminals of the "j" pieces of multipliers and "j+1"th to "2×j"th interconnects connecting the "j" pieces of multipliers and the "j" pieces of parallel clock input terminals of the digital circuit are arranged so that delays t2max are smaller out of the maximum value t1max s of delays caused on the first to the "j"th interconnects and the maximum value t2max s of delays caused on the "j+1"th to the "2×j"th interconnects and the delays t2max are equivalent to 1/10 or less of a clock cycle 1/f1 s output from each multiplier.

2. The receiver circuit according to claim 1, wherein:
the synchronous digital circuit comprises:

"j" pieces of flip-flops to which one data signal the data rate of which is f1 b/s and one clock signal having a frequency of f1 Hz are input and from which the data signal decided and recovered using the clock signal as a criterion of timing is output;

one or more frequency dividers to which the clock signal is input and from which a clock signal having a frequency equivalent to predetermined division ratio is output; and "j" pieces of demultiplexers to which the data signal output from the flip-flop and the clock signal output from the frequency divider are input and from which "k" channels of parallel data signals the data rate of each of which is f1/k b/s (k: 2 or larger natural number) acquired by demultiplexing the time-division multiplexed data signal using the clock signal output from the frequency divider as a criterion of timing are output.

3. The receiver circuit according to claim 2, wherein:
the synchronous circuit comprises:
a voltage controlled oscillator which is provided with an input terminal that can control a frequency by an input signal and from which a clock signal having a predetermined frequency is output;

a control circuit to which a phase difference signal or a frequency difference signal is input and from which a control signal over the voltage controlled oscillator is output; and a phase/frequency comparator to which a data signal the data rate of which is f1 b/s and a clock signal output from the voltage controlled oscillator are input and from which a signal showing phase difference or frequency difference between the data signal and the clock signal is output, wherein:

a terminal to which a data signal is input of the phase/frequency comparator functions as the input terminal and the output terminal of the voltage controlled oscillator functions as the output terminal; and wherein:

such control that the phase of an input data signal and the phase of an output clock signal are coincident and the ratio of the data rate of f1 b/s and a frequency of f1/n Hz is fixed to predetermined ratio is made.

4. The receiver circuit according to claim 3, further comprising:
a driver that amplifies a data signal output from the synchronous digital circuit;
a laser oscillator that generates an optical signal; and
a modulator that outputs a modulated signal acquired by modulating the optical signal according to a modulating signal output from the driver, wherein:
the driver, the laser oscillator and the modulator are provided between the output terminal of the synchronous digital circuit and the output terminal of the transmitter circuit; and
a data signal output from the output terminal of the transmitter circuit is an optical signal.

5. The receiver circuit according to claim 2, further comprising:
a photo diode that converts an optical signal to an electrical signal; and
a preamplifier that amplifies a signal from the photo diode, wherein:
the data signal input to the receiver circuit is an optical signal;
the optical signal is converted to an electrical signal via the photo diode and is input to the preamplifier; and
the output of the preamplifier is input to the synchronous digital circuit as a data input signal.

6. The receiver circuit according to claim 2, wherein:
the multiplier includes an exclusive-OR circuit and a 90-degree phase shifter; and
a signal input to the multiplier is branched, one is input to the exclusive-OR circuit, the branched other signal is input to the other terminal of the exclusive-OR circuit via the 90-degree phase shifter and the output of the exclusive-OR circuit functions as the output of the multiplier.

7. The receiver circuit according to claim 1, wherein:
the synchronous circuit comprises:
a voltage controlled oscillator which is provided with an input terminal that can control a frequency by an input signal and from which a clock signal having a predetermined frequency is output;

a control circuit to which a phase difference signal or a frequency difference signal is input and from which a control signal over the voltage controlled oscillator is output; and a phase/frequency comparator to which a data signal the data rata of which is f1 b/s and a clock signal output from the voltage controlled oscillator are input and from which a signal showing phase difference or frequency difference between the data signal and the clock signal is output, wherein:

a terminal to which a data signal is input of the phase/frequency comparator functions as the input terminal and the output terminal of the voltage controlled oscillator functions as the output terminal; and wherein:

such control that the phase of an input data signal and the phase of an output clock signal are coincident and the ratio of the data rate of f1 b/s and a frequency of f1/n Hz is fixed to predetermined ratio is made.

8. The receiver circuit according to claim 7, further comprising:
a photo diode that converts an optical signal to an electrical signal; and
a preamplifier that amplifies a signal from the photo diode, wherein:
the data signal input to the receiver circuit is an optical signal;
the optical signal is converted to an electrical signal via the photo diode and is input to the preamplifier; and
the output of the preamplifier is input to the synchronous digital circuit as a data input signal.

9. The receiver circuit according to claim 7, wherein:
the multiplier includes an exclusive-OR circuit and a 90-degree phase shifter; and
a signal input to the multiplier is branched, one is input to the exclusive-OR circuit, the branched other signal is input to the other terminal of the exclusive-OR circuit via the 90-degree phase shifter and the output of the exclusive-OR circuit functions as the output of the multiplier.

10. The receiver circuit according to claim 1, further comprising:
a photo diode that converts an optical signal to an electrical signal; and
a preamplifier that amplifies a signal from the photo diode, wherein:
the data signal input to the receiver circuit is an optical signal;
the optical signal is converted to an electrical signal via the photo diode and is input to the preamplifier; and
the output of the preamplifier is input to the synchronous digital circuit as a data input signal.

11. The receiver circuit according to claim 1, wherein:
the multiplier includes an exclusive-OR circuit and a 90-degree phase shifter; and
a signal input to the multiplier is branched, one is input to the exclusive-OR circuit, the branched other signal is input to the other terminal of the exclusive-OR circuit via the 90-degree phase shifter and the output of the exclusive-OR circuit functions as the output of the multiplier.

12. A transmitter circuit, comprising:
a synchronous circuit to which a clock signal having a frequency of f1/m/n Hz ( f1: positive real number, m: one or larger natural number, n: 2 or larger natural number) is input and from which a clock signal having a frequency of f1/n Hz and synchronized with the input clock signal is output;
"j" pieces of multipliers to which the clock signals output from the synchronous circuit are input via first to "j"th (j: one or larger natural number) interconnects and from each of which a clock signal multiplied by predetermined multiple ratio is output; and
a synchronous digital circuit that has input terminals for receiving "j×k" pieces of parallel data signals (k: 2 or larger natural number), output terminals for outputting "j" pieces of parallel data signals and "j" pieces of parallel clock input terminals, decides and recovers "j×k" pieces of data signals which are input to the input terminals and the data rate of each of which is f1/k b/s using "j" pieces of multiplied clock signals applied to "j" pieces of parallel clock input terminals via "j+1"th to "2×j"th interconnects as a criterion of timing, performs time-division multiplexing in the ratio of "k:1" and converts to "j" pieces of data signals the data rate of each of which is f1 b/s, wherein:
the terminals for receiving "j×k" pieces of parallel data signals of the synchronous digital circuit function as the input terminals of the transmitter circuit and the terminals for outputting "j" pieces of parallel data output signals function as the output terminals of the transmitter circuit; and
first to "j"th interconnects connecting the output terminal of the synchronous circuit and the input terminals of "j" pieces of multipliers and "j+1"th to "2×j"th interconnects connecting the "j" pieces of multipliers and "j" pieces of parallel clock input terminals of the digital circuit are arranged so that delays t2max are smaller out of the maximum value t1max s of delays caused on the first to the "j"th interconnects and the maximum value t2max s of delays caused on the "j+1"th to the "2×j"th interconnects and the delays t2max are equivalent to 1/10 or less of a clock cycle 1/f1 s output from each multiplier.

13. The transmitter circuit according to claim 12, wherein:
the synchronous digital circuit comprises:
one or more frequency dividers to which a clock signal having a frequency of f1 Hz is input and from which a clock signal having a frequency equivalent to predetermined division ratio is output;
"j" pieces of multiplexers that time-division multiplex "k" channels of parallel data signals (k: 2 or larger natural number) the data rate of each of which is f1/k b/s and output a serial signal the data rate of which is f1 b/s; and
"j" pieces of flip-flops to each of which one data signal output from the multiplexer and one clock signal having a frequency of f1 Hz are input and from each of which the data signal decided and recovered using the clock signal as a criterion of timing is output.

14. The transmitter circuit according to claim 13, wherein:
the synchronous digital circuit comprises:
an input terminal to which a clock signal having a frequency of f1/n Hz is input; and
an output terminal from which a clock signal having a frequency of f1/m/n Hz acquired by dividing the frequency of the clock signal in "m" pieces is output, wherein:
the synchronous circuit comprises:
an input terminal that can control a frequency by an input signal;
a voltage controlled oscillator from which a clock signal having a predetermined frequency is output;
a control circuit to which a phase difference signal or a frequency difference signal is input and from which a control signal over the voltage controlled oscillator is output; and
a phase/frequency comparator to which an input clock signal having a frequency of f1/m/n Hz and an output clock signal the frequency of which is divided output from the synchronous digital circuit are input and from which a signal showing phase difference or frequency difference between the input clock signal and the clock signal the frequency of which is divided is output; and
wherein:
the synchronous circuit is controlled so that a terminal to which an input clock signal is input of the phase/frequency comparator functions as the input terminal, the output terminal of the voltage controlled oscillator functions as the output terminal, phase difference and frequency difference between the input clock signal and the clock signal the frequency of which is divided output from the synchronous digital circuit are coincident and the frequency of an output clock signal is fixed to f1/n Hz.

15. The transmitter circuit according to claim 13, further comprising:
a driver that amplifies a data signal output from the synchronous digital circuit;
a laser oscillator that generates an optical signal; and
a modulator that outputs a modulated signal acquired by modulating the optical signal according to a modulating signal output from the driver, wherein:
the driver, the laser oscillator and the modulator are provided between the output terminal of the synchronous digital circuit and the output terminal of the transmitter circuit; and
a data signal output from the output terminal of the transmitter circuit is an optical signal.

16. The transmitter circuit according to claim 12, wherein:
the synchronous digital circuit comprises:
an input terminal to which a clock signal having a frequency of f1/n Hz is input; and
an output terminal from which a clock signal of f1/m/n Hz acquired by dividing the frequency of the clock signal in "m" pieces is output, wherein:
the synchronous circuit comprises:
an input terminal that can control a frequency by an input signal;
a voltage controlled oscillator from which a clock signal having a predetermined frequency is output;
a control circuit to which a phase difference signal or a frequency difference signal is input and from which a control signal over the voltage controlled oscillator is output; and
a phase/frequency comparator to which an input clock signal having a frequency of f1/m/n Hz and an output clock signal the frequency of which is divided output from the synchronous digital circuit are input and from which a signal showing phase difference or frequency difference between the input clock signal and the clock signal the frequency of which is divided is output; and wherein:
the synchronous circuit is controlled so that a terminal to which an input clock signal is input of the phase/frequency comparator functions as the input terminal, the output terminal of the voltage controlled oscillator functions as the output terminal, phase difference and frequency difference between the input clock signal and the clock signal the frequency of which is divided output from the synchronous digital circuit are coincident and the frequency of an output clock signal is fixed to f1/n Hz.

17. The transmitter circuit according to claim 16, wherein:
the multiplier includes an exclusive-OR circuit and a 90-degree phase shifter; and
a signal input to the multiplier is branched, one is input to the exclusive-OR circuit, the branched other signal is input to the other terminal of the exclusive-OR circuit via the 90-degree phase shifter and the output of the exclusive-OR circuit functions as the output of the multiplier.

18. The transmitter circuit according to claim 12, further comprising:
a driver that amplifies a data signal output from the synchronous digital circuit;
a laser oscillator that generates an optical signal; and
a modulator that outputs a modulated signal acquired by modulating the optical signal according to a modulating signal output from the driver, wherein:
the driver, the laser oscillator and the modulator are provided between the output terminal of the synchronous digital circuit and the output terminal of the transmitter circuit; and
a data signal output from the output terminal of the transmitter circuit is an optical signal.

19. A transceiver circuit comprising a receiver circuit and a transmitter circuit, wherein:
the receiver circuit comprises:
a synchronous circuit that recovers and outputs a clock signal having a frequency of f1/n Hz (n: 2 or larger natural number) synchronized with input one data signal the data rate of which is f1 b/s (f1: positive real number)
"j" pieces of multipliers that output each clock signal acquired by multiplying a clock signal output from the synchronous circuit by predetermined multiple ratio via "j" pieces of interconnects (j: one or larger natural number); and
a synchronous digital circuit that has "j" pieces of parallel input terminals including one common to the input of the synchronous circuit, "j×k" pieces of parallel output terminals and "j" pieces of parallel clock input terminals, decides and recovers "j" pieces of data signals the data rate of each of which is f1 b/s and which are input to the "j" pieces of parallel input terminals using the "j" pieces of multiplied clock signals applied to the "j" pieces of parallel clock input terminals via (j+1) th to (2×j) th interconnects as a criterion of timing, demultiplexes the data in the ratio of "1:k" and converts to "j×k" pieces of data signals the data rate of each of which is f1/k b/s, wherein:
the "j" pieces of parallel terminals to which data signals are input of the synchronous digital circuit function as the input terminal of the receiver circuit and the "j×k" pieces of parallel terminals from which the data signals are output function as the output terminal of the receiver circuit; and
first to "j"th interconnects connecting the output terminal of the synchronous circuit and the input terminals of the "j" pieces of multipliers and "j+1"th to "2×j"th interconnects connecting the "j" pieces of multipliers and the "j" pieces of parallel clock input terminals of the digital circuit are arranged so that delays t2max are smaller out of the maximum value t1max s of delays caused on the first to the "j"th interconnects and the maximum value t2max s of delays caused on the "j+1"th to the "2×j"th interconnects and the delays t2max are equivalent to ¹⁄₁₀ or less of a clock cycle 1/f1 s output from each multiplier, wherein:
the transmitter circuit comprises:
a synchronous circuit to which a clock signal having a frequency of f1/m/n Hz (f1: positive real number, m: one or larger natural number, n: 2 or larger natural number) is input and from which a clock signal having a frequency of f1/n Hz and synchronized with the input clock signal is output;
"j" pieces of multipliers to which the clock signals output from the synchronous circuit are input via first to "j"th (j: one or larger natural number) interconnects and from each of which a clock signal multiplied by predetermined multiple ratio is output; and a synchronous digital circuit that has input terminals for receiving "j×k" pieces of parallel data signals (k: 2 or larger natural number), output terminals for outputting "j" pieces of parallel data signals and pieces of parallel clock input terminals, decides and recovers "j×k" pieces of data signals which are input to the input terminals and the data rate of each of which is f1/k b/s using "j" pieces of multiplied clock signals applied to "j" pieces of parallel clock input terminals via "j+1"th to "2×j"th interconnects as a criterion of timing, performs time-division multiplexing in the ratio of "k:1" and converts to "j" pieces of data signals the data rate of each of which is f1 b/s, wherein:

the terminals for receiving "j×k" pieces of parallel data signals of the synchronous digital circuit function as the input terminals of the transmitter circuit and the terminals for outputting "j" pieces of parallel data output signals function as the output terminals of the transmitter circuit; and first to "j"th interconnects connecting the output terminal of the synchronous circuit and the input terminals of "j" pieces of multipliers and "j+1"th to "2×j"th interconnects connecting the "j" pieces of multipliers and "j" pieces of parallel clock input terminals of the digital circuit are arranged so that delays t2max are smaller out of the maximum value t1max s of delays caused on the first to the "j"th interconnects and the maximum value t2max s of delays caused on the "j+1"th to the "2×j"th interconnects and the delays t2max are equivalent to 1/10 or less of a clock cycle 1/f1 s output from each multiplier.

* * * * *